US012628502B2

(12) United States Patent
Jung

(10) Patent No.: US 12,628,502 B2
(45) Date of Patent: May 12, 2026

(54) DISPLAY APPARATUS AND MANUFACTURING METHOD THEREOF

(71) Applicant: Samsung Display Co., LTD., Yongin-si (KR)

(72) Inventor: Inyoung Jung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 468 days.

(21) Appl. No.: 18/196,198

(22) Filed: May 11, 2023

(65) Prior Publication Data

US 2024/0057393 A1      Feb. 15, 2024

(30) Foreign Application Priority Data

Aug. 10, 2022    (KR) ........................ 10-2022-0100200

(51) Int. Cl.
*H10K 59/122* (2023.01)
*H10K 59/80* (2023.01)

(52) U.S. Cl.
CPC ..... *H10K 59/122* (2023.02); *H10K 59/80515* (2023.02); *H10K 59/80522* (2023.02)

(58) Field of Classification Search
None
See application file for complete search history.

(56) References Cited

U.S. PATENT DOCUMENTS

| | | | |
|---|---|---|---|
| 8,362,469 B2 | 1/2013 | Suh | |
| 8,766,288 B2 | 7/2014 | Chen et al. | |
| 8,941,142 B2 | 1/2015 | Chung | |
| 2017/0125725 A1* | 5/2017 | Paek | H10K 71/60 |
| 2017/0186831 A1* | 6/2017 | Nam | H01L 23/544 |
| 2021/0343811 A1* | 11/2021 | Kim | H10K 59/124 |
| 2022/0209209 A1* | 6/2022 | Son | H10K 59/122 |

FOREIGN PATENT DOCUMENTS

| | | |
|---|---|---|
| CN | 102623644 A | 8/2012 |
| CN | 103824964 A | 5/2014 |
| CN | 109817694 A | 5/2019 |
| EP | 3742429 A1 | 11/2020 |
| KR | 101407590 B1 | 6/2014 |
| KR | 1020220044701 A | 4/2022 |

* cited by examiner

*Primary Examiner* — Michelle Mandala
(74) *Attorney, Agent, or Firm* — CANTOR COLBURN LLP

(57) ABSTRACT

A display apparatus includes a base layer, a power pad disposed on the base layer to overlap a peripheral region, and at least one upper auxiliary electrode extending in a first direction and having a low resistivity. The at least one upper auxiliary electrode includes a first portion adjacent to the power pad in the first direction and having a first thickness, and a second portion having a second thickness smaller than the first thickness.

11 Claims, 16 Drawing Sheets

Apply metal ink with coating device moving above second electrode in one direction —— S240

Apply metal ink with coating device moving above portion of metal ink applied onto second electrode in one direction —— S250

DISPLAY APPARATUS AND MANUFACTURING METHOD THEREOF

This application claims priority to Korean Patent Application No. 10-2022-0100200, filed on Aug. 10, 2022, and all the benefits accruing therefrom under 35 U.S.C. § 119, the content of which in its entirety is herein incorporated by reference.

BACKGROUND

The present disclosure herein relates to a display apparatus, and more particularly, to a display apparatus including an upper auxiliary electrode.

Various display apparatuses are developed which are used in multimedia devices such as mobile phones, navigation devices, game consoles, tablet computers, and televisions. A display apparatus includes various wirings in order to display a screen. A current flows through the wirings by power applied to the display apparatus to display the screen of the display apparatus. Here, as the current flows through the wirings, a voltage drop may occur. The voltage drop may cause display quality degradation in the display apparatus.

Accordingly, research is performed on various methods for reducing the voltage drop of the display apparatus.

SUMMARY

The present disclosure provides a display apparatus with reduced voltage drop and a manufacturing method of the display apparatus.

An embodiment of the invention provides: a display apparatus, which includes a display region and a peripheral region adjacent to the display region, the display region including light emitting regions and a non-light emitting region adjacent to each of the light emitting regions. The display apparatus includes a base layer, a power pad disposed on the base layer to overlap the peripheral region, a pixel defining film which is disposed on the base layer and in which an opening portion is defined to correspond to each of the light emitting regions, a first electrode disposed on the base layer and patterned to correspond to each of the light emitting regions, a light emitting layer disposed on the first electrode and patterned to correspond to each of the light emitting regions, a second electrode disposed on the light emitting layer and electrically connected to the power pad, and at least one upper auxiliary electrode that is disposed on the second electrode to overlap the non-light emitting region, extends in a first direction, and has a resistivity lower than a resistivity of the second electrode. The at least one upper auxiliary electrode includes a first portion, which is adjacent to the power pad in the first direction and has a first thickness, and a second portion which has a second thickness smaller than the first thickness and is spaced apart from the power pad with the first portion therebetween.

In an embodiment, the at least one upper auxiliary electrode may have a thickness that gradually decreases from the first portion toward the second portion.

In an embodiment, the first portion may be more adjacent to the power pad than the second portion.

In an embodiment, the light emitting region may include first to third light emitting regions disposed apart from each other. The first light emitting region may emit first light, the second light emitting region may emit second light having a different wavelength from the first light, and the third light emitting region may emit third light having a different wavelength from the first light and the second light.

In an embodiment, the at least one upper auxiliary electrode may include a first upper auxiliary electrode, and a second upper auxiliary electrode disposed apart from the first upper auxiliary electrode with at least one of the first to third light emitting regions therebetween in a second direction perpendicular to the first direction.

In an embodiment, the at least one upper auxiliary electrode may have a resistivity of greater than about 0 ohm-centimeter ($\Omega$cm) and less than or equal to about $4.4 \times 10^{-6}$ $\Omega$cm.

In an embodiment, the at least one upper auxiliary electrode may include silver (Ag) or copper (Cu).

In an embodiment, the display apparatus may further include a hole transport region, which is disposed between the first electrode and the light emitting layer, and an electron transport region which is disposed between the light emitting layer and the second electrode. Each of the hole transport region and the electron transport region may extend to be disposed above the pixel defining film.

In an embodiment, an auxiliary opening portion may be defined in the pixel defining film to overlap the at least one upper auxiliary electrode, and a contact hole may be defined to pass through the hole transport region and the electron transport region that extend into the upper auxiliary electrode. The display apparatus may further include a lower auxiliary electrode disposed on the base layer and having a top surface exposed by the contact hole.

In an embodiment, the at least one upper auxiliary electrode may be electrically connected to the second electrode.

In an embodiment, the display apparatus may further include a plurality of crossing-upper auxiliary electrodes extending in a second direction perpendicular to the first direction, and a distance between adjacent crossing-upper auxiliary electrodes among the plurality of crossing-upper auxiliary electrodes may increase as being farther away from the power pad.

In an embodiment of the invention, a display apparatus, which includes a display region and a peripheral region adjacent to the display region, the display region including a first light emitting group including first light emitting regions arranged in a first direction, a second light emitting group including second light emitting regions arranged in the first direction, and a third light emitting group including third light emitting regions arranged in the first direction, the first, second, and third light emitting groups being repeatedly arranged in an order of the first light emitting group, the second light emitting group, and the third light emitting group and apart from each other in a second direction perpendicular to the first direction so as to be provided in plural, includes: a base layer; a pixel defining film which is disposed on the base layer and in which an opening portion is defined; a first electrode disposed on the base layer and having a top surface exposed in the opening portion; a light emitting layer disposed on the first electrode within the opening portion; a second electrode disposed on the light emitting layer and extending to be disposed above the pixel defining film; and an upper auxiliary electrode that is disposed between neighboring first and second light emitting groups of the first and second light emitting groups, neighboring second and third light emitting groups of the second and third light emitting groups, or neighboring first and third light emitting groups of the first and third light emitting groups, has a resistivity lower than a resistivity of the second electrode, and extends in the first direction. The upper auxiliary electrode includes a first portion, which is adjacent to one side of the peripheral region and has a first thickness, and a second portion which has a second thickness smaller than the first thickness.

In an embodiment, the upper auxiliary electrode may have a thickness that gradually decreases from the first portion toward the second portion.

In an embodiment, the upper auxiliary electrode may have a resistivity of greater than about 0 Ωcm and less than or equal to about $4.4 \times 10^{-6}$ Ωcm.

In an embodiment, the upper auxiliary electrode may include silver (Ag) or copper (Cu).

In an embodiment, the display apparatus may further include a power pad overlapping the peripheral region and disposed on the base layer to be adjacent to the first portion.

In an embodiment, the display apparatus may further include a plurality of crossing-upper auxiliary electrodes extending in the second direction, and a distance between adjacent crossing-upper auxiliary electrodes among the plurality of crossing-upper auxiliary electrodes may increase as being farther away from the power pad.

In an embodiment of the invention, a display apparatus manufacturing method includes: providing a preliminary display apparatus, which includes a base layer, a pixel defining film which is disposed on the base layer and in which an opening portion is defined, a first electrode disposed on the base layer and having a top surface exposed in the opening portion, a light emitting layer disposed on the first electrode within the opening portion, and a second electrode disposed on the light emitting layer and extending to be disposed above the pixel defining film; and forming an upper auxiliary electrode by applying a metal ink with a coating device moving above the second electrode non-overlapping the light emitting layer and in one direction. The upper auxiliary electrode may include a first portion having a first thickness and a second portion having a second thickness smaller than the first thickness.

In an embodiment, the forming of the upper auxiliary electrode may include: first-applying the metal ink with the coating device moving above the second electrode at a first speed in the one direction, and second-applying the metal ink with the coating device moving above the second electrode at a second speed higher than the first speed in the one direction.

In an embodiment, the second applying may be performed after the first applying, and a speed of the coating device may gradually increase from the first speed to the second speed.

In an embodiment, the display apparatus manufacturing method may further include: stopping movement of the coating device between the first applying and the second applying. After the stopping, a speed of the coating device may change to the second speed.

In an embodiment, the forming of the upper auxiliary electrode may include: first-applying the metal ink with the coating device moving above the second electrode in one direction, and second-applying the metal ink onto a portion with the coating device moving above the second electrode coated with the metal ink in the one direction. The first portion may be coated with the metal ink both in the first applying and in the second applying, and the second portion may be coated with the metal ink in the first applying, not in the second applying.

BRIEF DESCRIPTION OF THE FIGURES

The accompanying drawings are included to provide a further understanding of the invention, and are incorporated in and constitute a part of this specification. The drawings illustrate embodiments of the invention and, together with the description, serve to explain principles of the invention. In the drawings:

FIG. 2A is a plan view of a display apparatus according to an embodiment;

FIG. 5 is a cross-sectional view of a display apparatus according to an embodiment;

FIG. 6 is a cross-sectional view of a display apparatus according to an embodiment;

DETAILED DESCRIPTION

Figure 1:
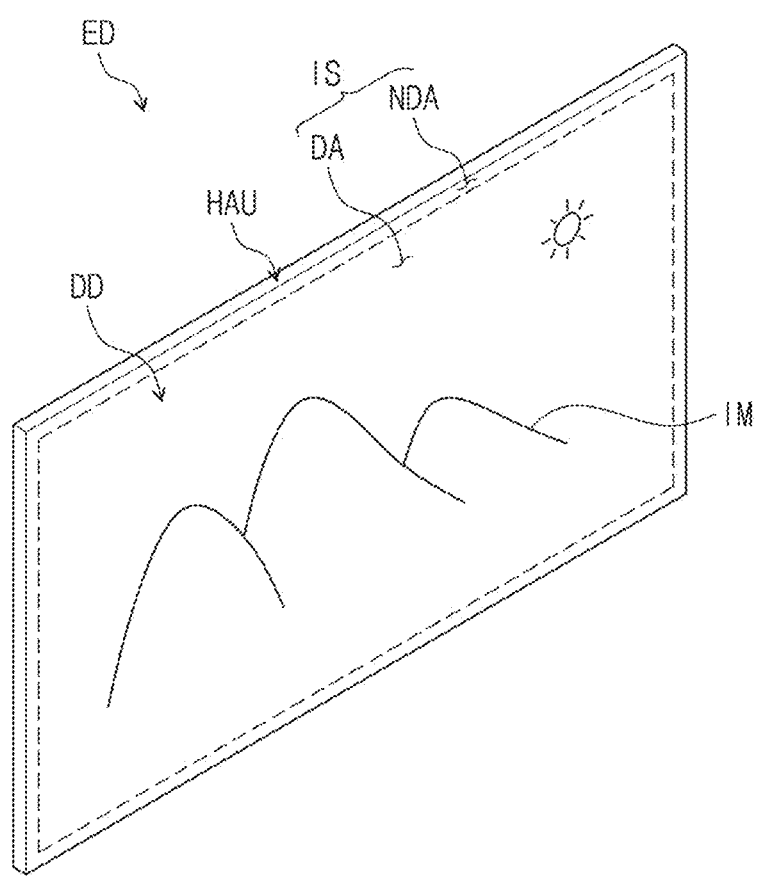
FIG. 1 is a perspective view illustrating an electronic apparatus according to an embodiment.
Figure 1:
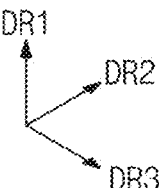

It will be understood that when an element (or region, layer, section, etc.) is referred to as being "on", "connected to" or "coupled to" another element, it can be disposed directly on, connected or coupled to the other element or a third intervening element may be disposed between the elements.

Like reference numbers or symbols refer to like elements throughout. In addition, in the drawings, the thickness, the ratio, and the dimension of elements are exaggerated for effective description of the technical contents. The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." The term "and/or" includes one or more combinations which may be defined by relevant elements.

It will be understood that, although the terms "first", "second", etc. may be used herein to describe various elements, these elements should not be limited by these terms. These terms are only used to distinguish one element from another element. For example, a first element could be termed a second element without departing from the teachings of the present invention, and similarly, a second element could be termed a first element. As used herein, the singular forms are intended to include the plural forms as well, unless the context clearly indicates otherwise.

In addition, the terms, such as "below", "beneath", "on" and "above", are used for explaining the relation of elements shown in the drawings. The terms are relative concepts and are explained based on the direction shown in the drawing.

It will be further understood that the terms such as "includes" or "has", when used herein, specify the presence of stated features, numerals, steps, operations, elements, parts, or the combination thereof, but do not preclude the presence or addition of one or more other features, numerals, steps, operations, elements, parts, or the combination thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value. Hereinafter, a display apparatus according to an embodiment of the invention will be described with reference to the accompanying drawings.

FIG. 1 is a perspective view illustrating an electronic apparatus according to an embodiment.

Referring to FIG. 1, in an embodiment, an electronic apparatus ED may be a large-sized electronic apparatus such as a television, a monitor, or an outdoor billboard. In addition, the electronic apparatus ED may be a small and medium-sized electronic apparatus such as a personal computer, a notebook computer, a personal digital assistant, a vehicle navigation unit, a game console, a smartphone, a tablet computer, and a camera. These are just provided as examples, and another electronic apparatus may be employed unless departing from the invention.

The electronic apparatus ED may include a display apparatus DD and a housing HAU. The display apparatus DD may be accommodated in the housing HAU. The housing HAU may be disposed while covering the display apparatus DD, so that an upper surface that is a display surface IS of the display apparatus DD is exposed. The housing HAU may cover a side surface and a bottom surface of the display apparatus DD and expose the entirety of the upper surface. However, an embodiment is not limited thereto, and the housing HAU may cover a portion of the upper surface of the display apparatus DD in addition to the side surface and the bottom surface.

In FIG. 1 and the following drawings, a first directional axis DR1 to a third directional axis DR3 are illustrated, and directions indicated by the first to third directional axes DR1, DR2 and DR3 used herein are relative concepts and may be changed to other directions. In addition, first to third directions used herein may be the directions indicated by the first to third directional axes DR1, DR2 and DR3, respectively, and may be designated by the same reference numbers or symbols. In the present disclosure, the first directional axis DR1 and the second directional axis DR2 perpendicularly cross each other, and the third directional axis DR3 may be a normal direction to a plane defined by the first directional axis DR1 and the second directional axis DR2.

In the present disclosure, a thickness direction of the electronic apparatus ED or the display apparatus DD may be a direction parallel to a third direction DR3 that is a normal direction to a plane defined by a first direction DR1 and a second direction DR2. In the present disclosure, a front surface (or top surface) and a rear surface (or bottom surface) of each of members, which constitute the display apparatus DD, may be defined based on the third direction DR3. As used herein, the "plan view" and "on a plane" means a view in the thickness direction.

FIG. 1 illustrates that the display surface IS of the electronic apparatus ED according to an embodiment is parallel to a surface defined by the first direction DR1 and the second direction DR2 crossing the first direction DR1. However, this is an example, and in an embodiment, the display surface IS of the electronic apparatus ED may have a curved shape.

The display apparatus DD according to an embodiment may include a display region DA and a non-display region NDA adjacent to the display region DA. The display region DA corresponds to a part in which an image IM is displayed.

In an embodiment, the display region DA may have a quadrilateral shape. The non-display region NDA may surround the display region DA. However, an embodiment of the invention is not limited thereto, and the shape of the display region DA and the shape of the non-display region NDA may be relatively designed. In addition, the non-display region NDA may not be present on the display surface IS that is a front surface of the display apparatus DD.

Figure 2A:
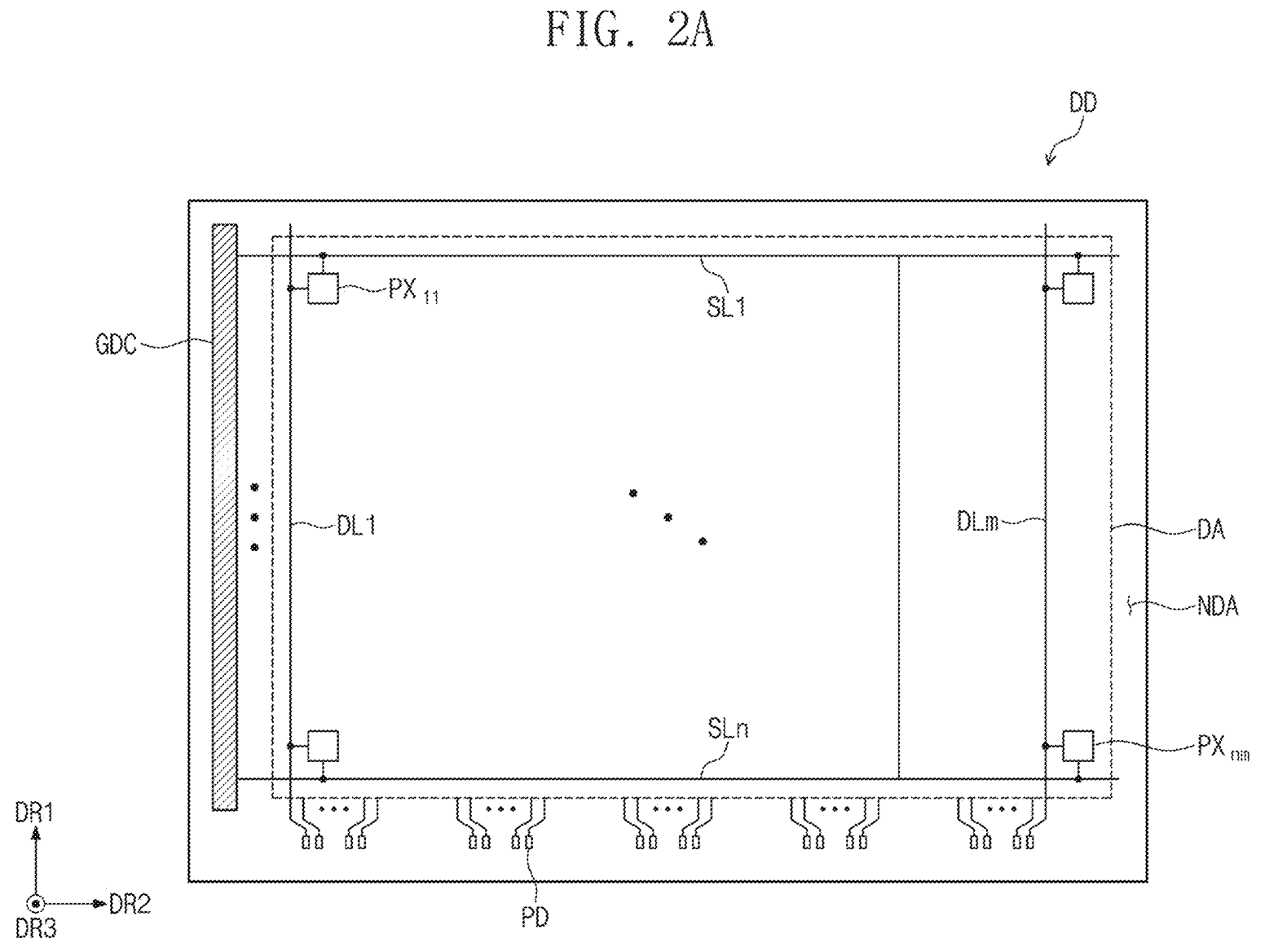
Figure 2B:
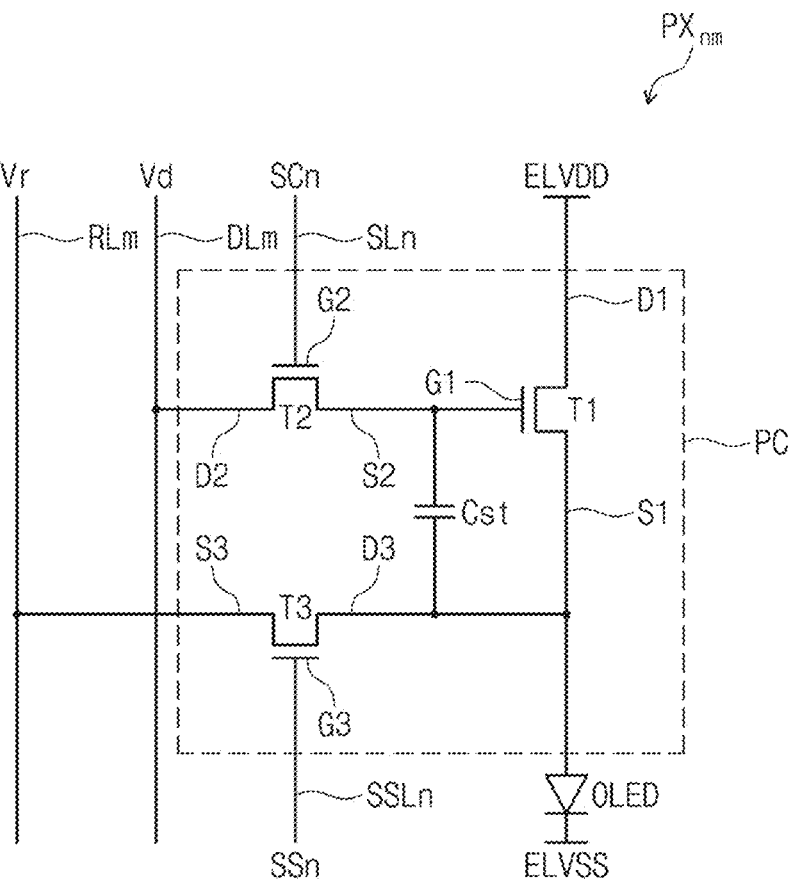
FIG. 2B is an equivalent circuit diagram of a pixel according to an embodiment.

FIG. 2A is a plan view of a display apparatus according to an embodiment. FIG. 2B is an equivalent circuit diagram of a pixel according to an embodiment.

Referring to FIG. 2A, the display apparatus DD may include pixels $PX_{11}$ to $PX_{nm}$ disposed in the display region DA, and signal lines SL1 to SLn and DL1 to DLm electrically connected to the pixels $PX_{11}$ to $PX_{nm}$. The display apparatus DD may include a driving circuit GDC and power pads PD disposed in the non-display region NDA.

The power pads PD may be disposed adjacent to a lower side of the display apparatus DD. In the present disclosure, the lower side of the display apparatus DD may be an edge adjacent to a side extending in the second direction DR2 on a plane defined by a side extending in the first direction DR1 and the side extending in the second direction DR2. Accordingly, the display region DA may be divided into a portion relatively adjacent to the power pads PD and a portion relatively far away from the power pads PD. Although the power pads PD are not illustrated in FIG. 3 for the sake of convenience, going in a direction indicated by the first directional axis DR1 is defined as being farther away from the power pads PD.

Each of the pixels $PX_{11}$ to $PX_{nm}$ may include a pixel driving circuit constituted by a light emitting element, a plurality of transistors (e.g., switch transistor, driving transistor, etc.) connected to the light emitting element, and a capacitor, which will be described later. Each of the pixels $PX_{11}$ to $PX_{nm}$ may emit light in response to an electrical signal applied to the pixel. FIG. 2A illustrates, as an example, the pixels $PX_{11}$ to $PX_{nm}$ arranged in the form of a matrix, but the arrangement configuration of the pixels $PX_{11}$ to $PX_{nm}$ is not limited thereto.

The signal lines SL1 to SLn and DL1 to DLm may include scan lines SL1 to SLn and data lines DL1 to DLm. Each of the pixels $PX_{11}$ to $PX_{nm}$ may be connected to a corresponding scan line among the scan lines SL1 to SLn and a corresponding data line among the data lines DL1 to DLm. According to the configuration of the pixel driving circuit of the pixels $PX_{11}$ to $PX_{nm}$, more types of signal lines may be provided in the display apparatus DD.

The driving circuit GDC may include a gate driving circuit. The gate driving circuit may generate gate signals and sequentially output the gate signals to the scan lines SL1 to SLn. The gate driving circuit may further output another control signal to the pixel driving circuit of the pixels $PX_{11}$ to $PX_{nm}$.

The driving circuit GDC and the pixels $PX_{11}$ to $PX_{nm}$ according to an embodiment may include a plurality of thin film transistors formed through a low temperature polycrystalline silicon ("LTPS") process, a low temperature polycrystalline oxide ("LTPO") process, or an oxide semiconductor process.

The power pads PD may be arranged on the non-display region NDA along one direction. The power pads PD may be parts connected to a circuit board. Each of the power pads PD may be connected to a corresponding signal line among the signal lines SL1 to SLn and DL1 to DLm, and may be electrically connected to a corresponding pixel through the signal line. The power pads PD may have a shape integrally formed with the signal lines SL1 to SLn and DL1 to DLm. However, an embodiment of the invention is not limited thereto, and the power pads PD may be disposed on a different layer from a layer on which the signal lines SL1 to SLn and DL1 to DLm are disposed to be connected to the signal lines SL1 to SLn and DL1 to DLm through contact holes.

FIG. 2B illustrates, as an example, a pixel $PX_{nm}$ connected to an nth scan line SLn, an nth sensing line SSLn, an m-th data line DLm, and an m-th reference line RLm. Referring to FIG. 2B, the pixel $PX_{nm}$ may include a pixel circuit PC and a light emitting element OLED connected to the pixel circuit PC.

The pixel circuit PC may include a plurality of transistors T1, T2 and T3 and a capacitor Cst. The plurality of transistors T1, T2 and T3 may include a first transistor T1 (or driving transistor), a second transistor T2 (or switch transistor), and a third transistor T3 (or sensing transistor). Each of the first to third transistors T1, T2 and T3 may be a thin film transistor.

The first to third transistors T1, T2 and T3 may be NMOS transistors, but are not limited thereto and may be PMOS transistors. Each of the first to third transistors T1, T2 and T3 may include a source S1, S2 and S3, a drain D1, D2 and D3, and a gate G1, G2 and G3.

Figure 5:
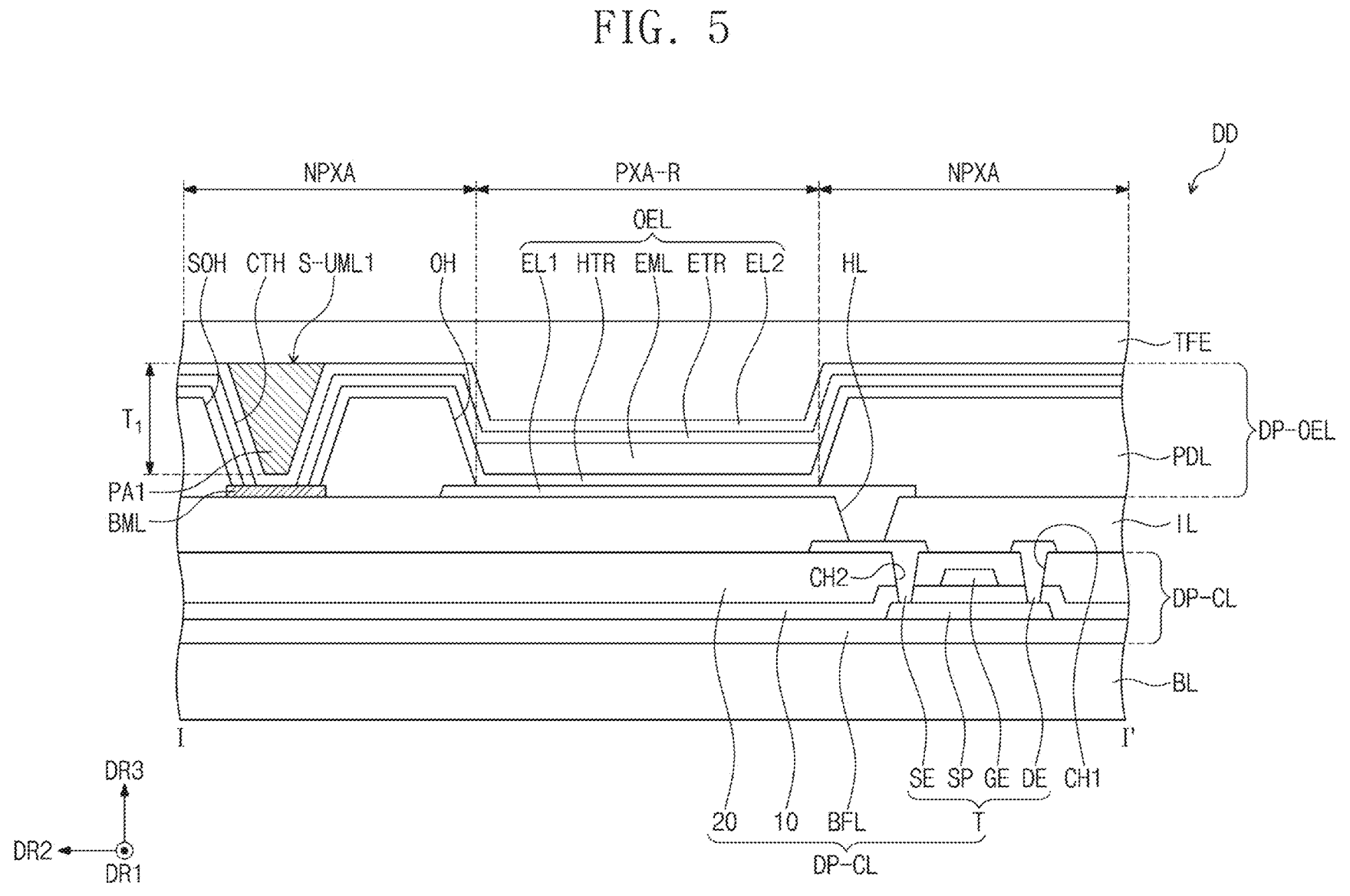

The light emitting element OLED may be an organic light emitting element including a first electrode EL1 (see FIG. 5) and a second electrode EL2 (see FIG. 5). The first electrode EL1 (see FIG. 5) may be referred to as an anode or a pixel electrode, and the second electrode EL2 (see FIG. 5) may be referred to as a cathode or a common electrode. The first electrode EL1 (see FIG. 5) of the light emitting element OLED may receive a first voltage ELVDD through the driving transistor T1, and the second electrode EL2 (see FIG. 5) of the light emitting element OLED may receive a second voltage ELVSS. The light emitting element OLED may receive the first voltage ELVDD and the second voltage ELVSS to emit light.

The driving transistor T1 may include the drain D1 that receives the first voltage ELVDD, the source S1 connected to the first electrode EL1 (see FIG. 5) of the light emitting element OLED, and the gate G1 connected to the capacitor Cst. The driving transistor T1 may control a driving current flowing through the light emitting element OLED from the first voltage ELVDD according to a value of a voltage stored in the capacitor Cst.

The switch transistor T2 may include the drain D2 connected to the m-th data line DLm, the source S2 connected to the capacitor Cst, and the gate G2 that receives an nth write scan signal SCn. The m-th data line DLm may receive a data voltage Vd and a data voltage for sensing. The switch transistor T2 may deliver, to the driving transistor T1, the data voltage Vd input from the m-th data line DLm according to a switching voltage input from the nth write scan signal SCn.

The sensing transistor T3 may include the source S3 connected to the m-th reference line RLm, the drain D3 connected to the first electrode EL1 (see FIG. 5) of the light emitting element OLED, and the gate G3 that receives an nth sampling scan signal SSn. The m-th reference line RLm may receive a reference voltage Vr.

The capacitor Cst may be connected to the gate G1 of the driving transistor T1 and the first electrode EL1 (see FIG. 5) of the light emitting element OLED. The capacitor Cst may include a first capacitor electrode, which is connected to the gate G1 of the driving transistor T1, and a second capacitor electrode which is connected to the first electrode EL1 (see FIG. 5) of the light emitting element OLED. The capacitor Cst may store a voltage corresponding to a difference between a voltage transmitted from the switch transistor T2 and the first voltage ELVDD.

An equivalent circuit of the pixel $PX_{nm}$ illustrated in FIG. 2B is exemplarily illustrated with respect to the single pixel $PX_{nm}$, and the equivalent circuit of the pixels $PX_{11}$ to $PX_{nm}$ is not limited to that illustrated in FIG. 2B. In another embodiment of the invention, the equivalent circuit diagram of the pixel $PX_{nm}$ may be embodied in various forms in order for the light emitting element OLED to emit light.

Figure 3:
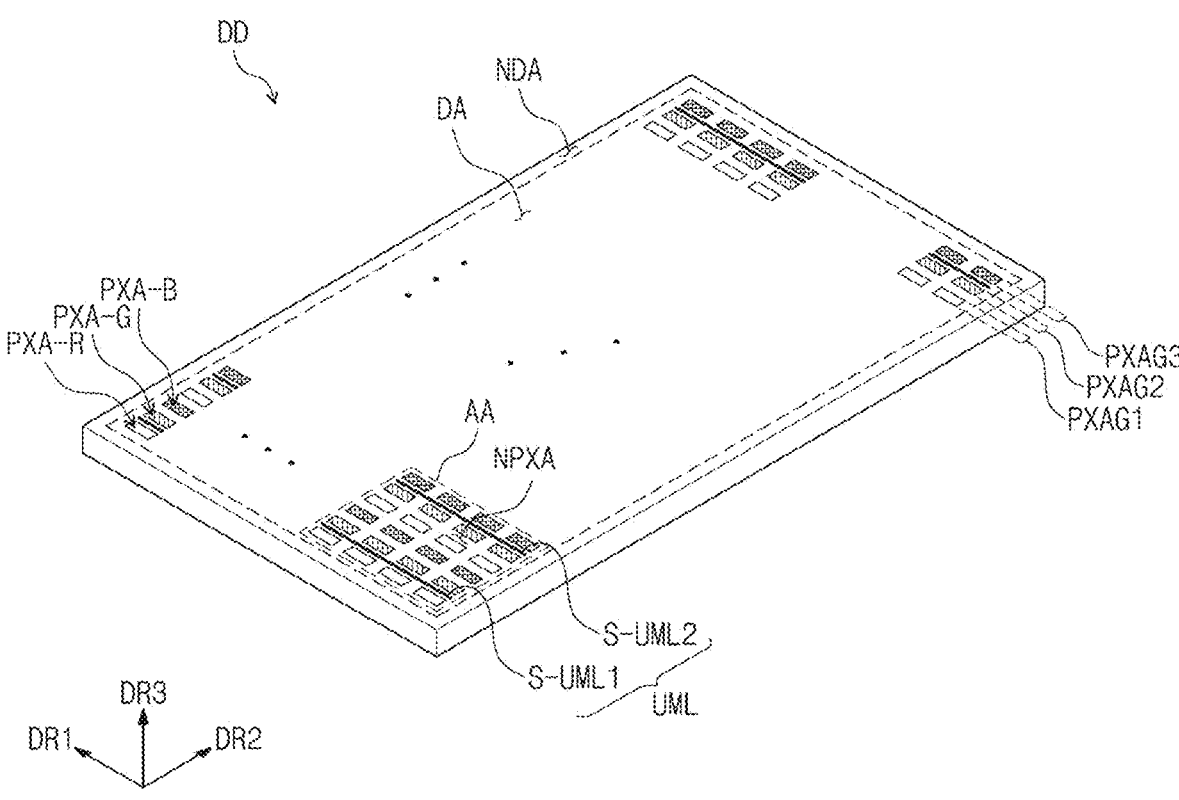
FIG. 3 is a plan view of the display apparatus according to an embodiment.
Figure 4:
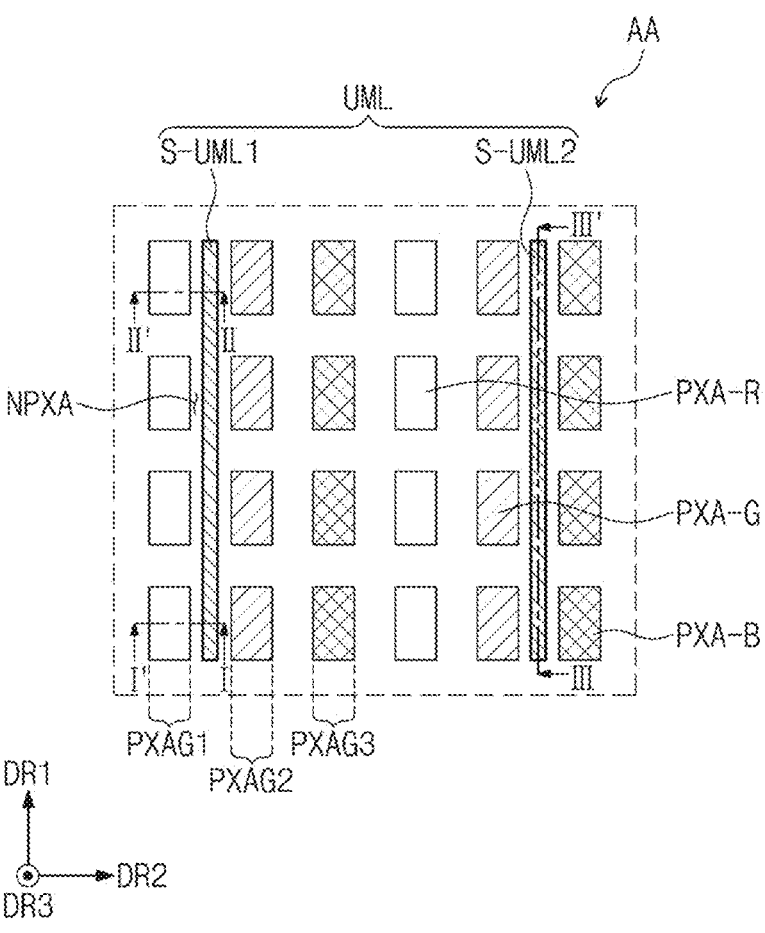
FIG. 4 is an enlarged plan view of the display apparatus according to an embodiment, and illustrates a portion corresponding to area AA in FIG. 3.

FIG. 3 is a plan view of a display apparatus according to an embodiment. FIG. 4 is an enlarged plan view of a display apparatus according to an embodiment. FIG. 4 illustrates a portion corresponding to area AA in FIG. 3.

Referring to FIGS. 3 and 4, the display apparatus DD according to an embodiment may include a plurality of light emitting regions PXA-R, PXA-G and PXA-B. FIGS. 3 and 4 are plan views illustrating the display apparatus DD before an encapsulation layer TFE 15 provided. The display apparatus DD according to an embodiment may include first to third light emitting regions PXA-R, PXA-G and PXA-B. For example, the display apparatus DD according to an embodiment may include the first light emitting region PXA-R, the second light emitting region PXA-G, and the third light emitting region PXA-B, which are distinguished from each other. In an embodiment, the first light emitting region PXA-R may be a red light emitting region that emits red light, the second light emitting region PXA-G may be a green light emitting region that emits green light, and the third light emitting region PXA-B may be a blue light emitting region that emits blue light.

The first to third light emitting regions PXA-R, PXA-G and PXA-B may be divided without overlapping each other when seen on a plane (i.e., in a plan view). For example, a non-light emitting region NPXA may be disposed between neighboring light emitting regions PXA-R, PXA-G and PXA-B.

FIGS. 3 and 4 illustrate the display apparatus DD according to an embodiment in which the light emitting regions PXA-R, PXA-G and PXA-B are arranged in a stripe shape within the display region DA. That is, in the display apparatus DD according to an embodiment illustrated in FIG. 2A, a plurality of first light emitting regions PXA-R, a plurality of second light emitting regions PXA-G, and a plurality of third light emitting regions PXA-B may be each arranged along the first direction DR1. In addition, the first light emitting region PXA-R, the second light emitting region PXA-G, and the third light emitting region PXA-B may be repeatedly arranged in this order along the second direction DR2.

The arrangement configuration of the light emitting regions PXA-R, PXA-G and PXA-B is not limited to what is illustrated in FIG. 3. The arranging order of the first light emitting region PXA-R, the second light emitting region PXA-G, and the third light emitting region PXA-B may be provided in various combinations according to a display quality property for the display apparatus DD. In an embodiment, the light emitting regions PXA-R, PXA-G and PXA-B, which emit light in different wavelength ranges, among the plurality of light emitting regions PXA-R, PXA-G and PXA-B may have the same area. Here, the area may mean an area when seen on a plane defined by the first direction DR1 and the second direction DR2 (hereinafter referred to as "on a plane"). However, an embodiment is not limited thereto. The light emitting regions PXA-R, PXA-G and PXA-B may have different areas in another embodiment. In addition, the area ratio may be variously adjusted according to the display quality property for the display apparatus DD, and the shapes of the light emitting regions PXA-R, PXA-G and PXA-B on a plane may be variously modified.

The display apparatus DD may include light emitting groups PXAG1, PXAG2 and PXAG3. In the display apparatus DD, the light emitting groups PXAG1, PXAG2 and PXAG3 may include the plurality of first light emitting regions PXA-R, the plurality of second light emitting regions PXA-G, and the plurality of third light emitting regions PXA-B, respectively, which are arranged along the first direction DR1. On a plane, the light emitting groups PXAG1, PXAG2 and PXAG3 may be arranged apart from each other in the second direction DR2. The light emitting groups PXAG1, PXAG2 and PXAG3 may be arranged alternately along the second direction DR2 in an order of a first light emitting group PXAG1, a second light emitting group PXAG2, and a third light emitting group PXAG3. Each of the light emitting groups PXAG1, PXAG2 and PXAG3 may include the non-light emitting region NPXA disposed between the light emitting regions PXA-R, PXA-G and PXA-B on a plane defined by the first direction DR1 and the second direction DR2. The non-light emitting region NPXA may be disposed in every space between the light emitting groups PXAG1, PXAG2 and PXAG3.

In an embodiment, the display apparatus DD may include an upper auxiliary electrode UML disposed between the light emitting groups PXAG1, PXAG2 and PXAG3 on a plane. The upper auxiliary electrode UML may have a line shape extending in the first direction DR1 on a plane (i.e., in a plan view).

The upper auxiliary electrode UML may include a plurality of upper auxiliary electrodes S-UML1 and S-UML2. As illustrated in FIG. 3, each of the upper auxiliary electrodes S-UML1 and S-UML2 may be disposed between the light emitting groups PXAG1, PXAG2 and PXAG3. FIG. 4 illustrates that the upper auxiliary electrodes S-UML1 and S-UML2 are disposed only in some of regions, each of which is between the light emitting groups PXAG1, PXAG2 and PXAG3. However, an embodiment is not limited thereto. For example, in another embodiment, the upper auxiliary electrodes UML may be disposed in all of the regions, respectively, where each of the regions is between the light emitting groups PXAG1, PXAG2 and PXAG3.

The upper auxiliary electrodes S-UML1 and S-UML2 may be disposed apart from each other with at least one of the light emitting groups PXAG1, PXAG2 and PXAG3 therebetween in the second direction DR2. For example, as illustrated in FIG. 4, a first upper auxiliary electrode S-UML1 and a second upper auxiliary electrode S-UML2 may be disposed apart from each other with two light emitting groups therebetween in the second direction DR2. However, this is just an example, and an embodiment is not limited thereto. The first upper auxiliary electrode S-UML1 and the second upper auxiliary electrode S-UML2 may be disposed apart from each other with one light emitting group therebetween in the second direction DR2, or may be disposed apart from each other with three or more light emitting groups therebetween in the second direction DR2 in another embodiment.

Figure 6:
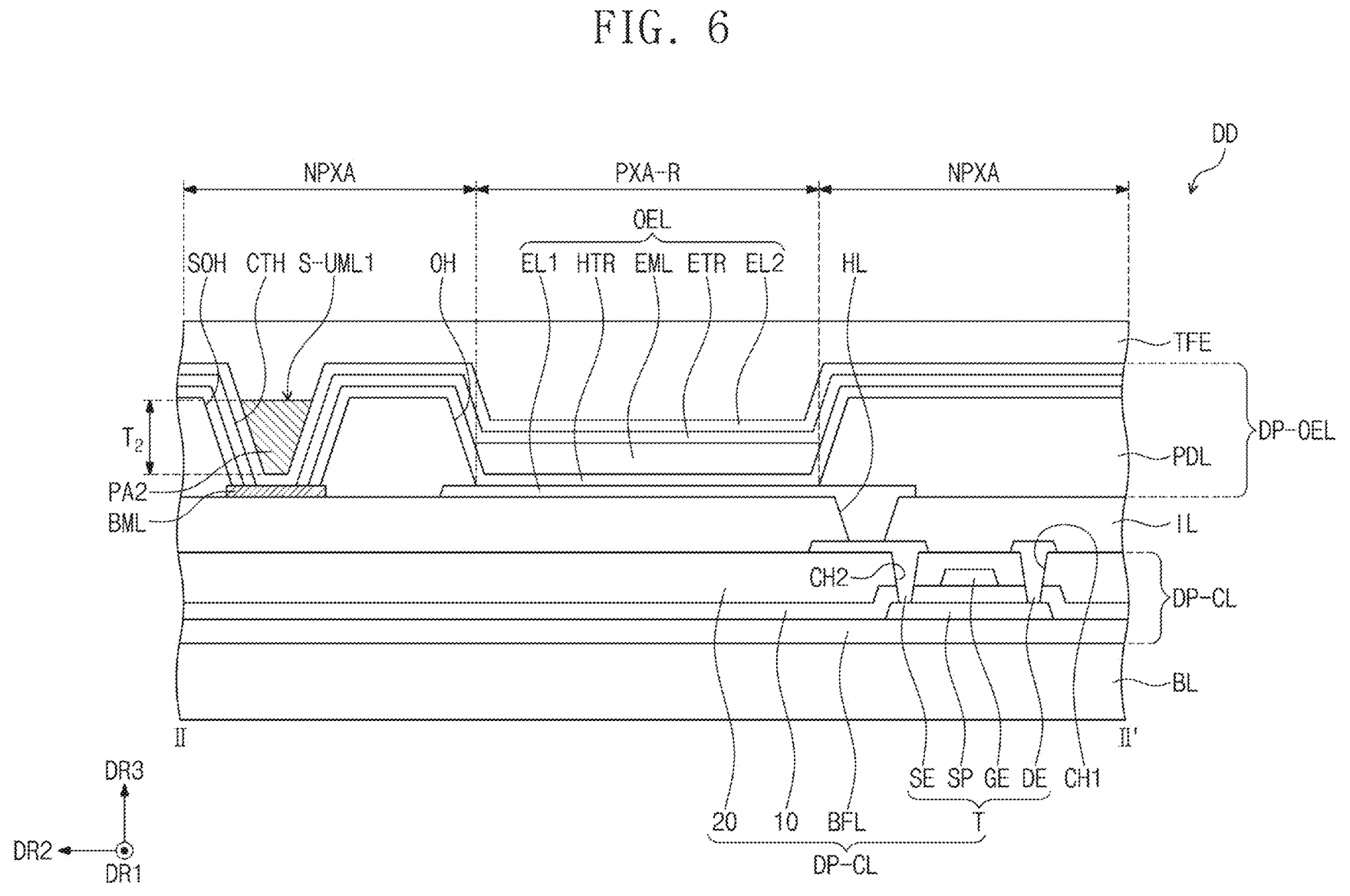
Figure 7A:
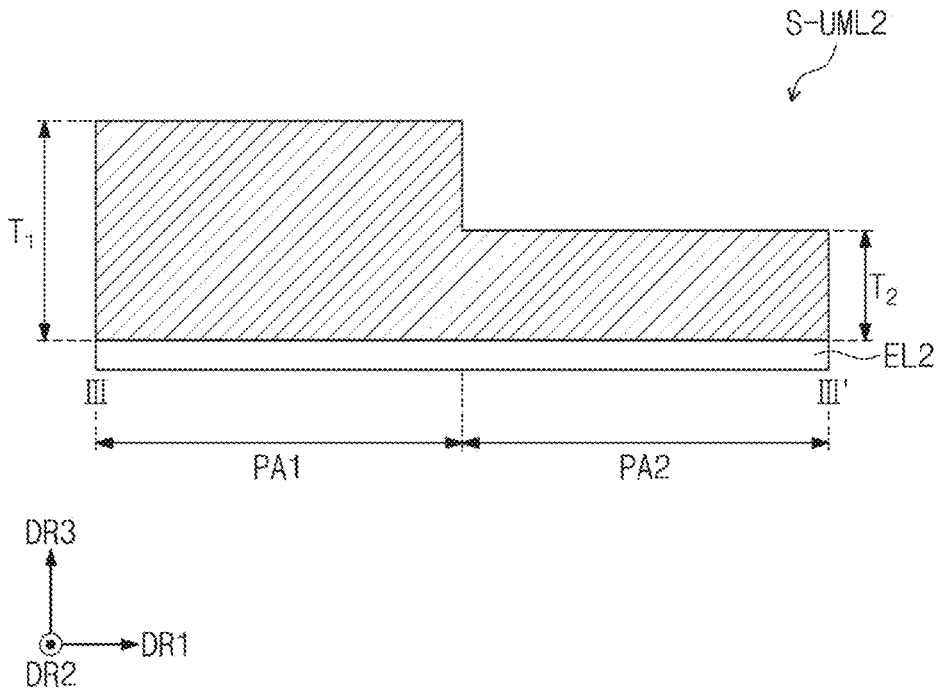
FIG. 7A is a cross-sectional view of a display apparatus according to an embodiment.
Figure 7B:
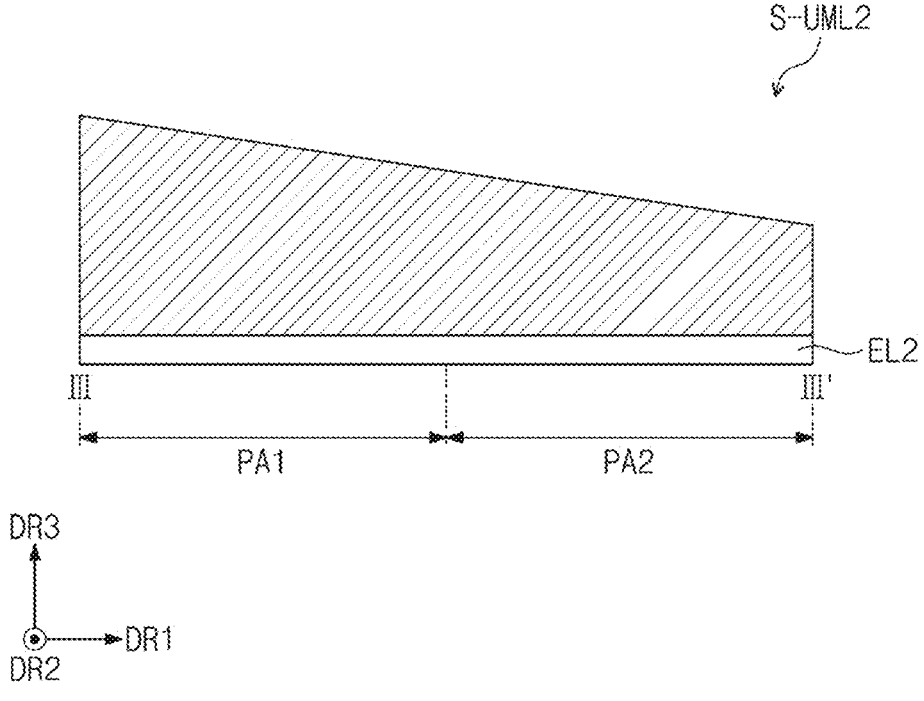
FIG. 7B is a cross-sectional view of a display apparatus according to an embodiment.

FIG. 5 is a cross-sectional view of a display apparatus according to an embodiment. FIG. 6 is a cross-sectional view of a display apparatus according to an embodiment. FIG. 7A is a cross-sectional view of a display apparatus according to an embodiment. FIG. 7B is a cross-sectional view of a display apparatus according to an embodiment. FIG. 5 may be a cross-sectional view of a portion corresponding to line I-I' illustrated in FIG. 4. FIG. 6 may be a cross-sectional view of a portion corresponding to line II-IP illustrated in FIG. 4. FIGS. 7A and 7B may be each a cross-sectional view of a portion corresponding to line illustrated in FIG. 4.

Referring to FIGS. 5 and 6, the display apparatus DD may include a base layer BL, a circuit layer DP-CL, an insulating layer IL, a display element layer DP-OEL, the upper auxiliary electrode UML, and a lower auxiliary electrode BML, and an encapsulation layer TFE.

In an embodiment, the base layer BL may provide a base surface on which the circuit layer DP-CL and a light emitting element OEL are disposed. The base layer BL may be a glass substrate, a metal substrate, or a plastic substrate. However, this is just an example, and an embodiment is not limited thereto. For example, the base layer BL may be an inorganic layer, an organic layer, or a composite material layer including an organic material and an inorganic material.

In an embodiment, the circuit layer DP-CL may be disposed on the base layer BL. The circuit layer DP-CL may include a buffer layer BFL that is an inorganic film. The buffer layer BFL may prevent impurities from diffusing into the transistor T. The buffer layer BFL may include at least one of silicon nitride ($SiN_x$), silicon oxide ($SiO_x$), or silicon oxynitride ($SiO_xN_y$). The buffer layer BFL may be omitted, and the transistor T may be disposed directly on the base layer BL.

In an embodiment, a semiconductor pattern SP of the transistor T may be disposed on the buffer layer BFL. The semiconductor pattern may include amorphous silicon, polysilicon, or a metal oxide. A first intermediate insulating layer 10 may be disposed on the semiconductor pattern SP. A control electrode GE may be disposed on the first intermediate insulating layer 10. The first intermediate insulating layer 10 may include an organic material, an inorganic material, or a mixture thereof.

A second intermediate insulating layer 20 that covers the control electrode GE may be disposed on the first intermediate insulating layer 10. The second intermediate insulating layer 20 may include an organic material, an inorganic material, or a mixture thereof.

An input electrode DE and an output electrode SE may be disposed on the second intermediate insulating layer 20. The input electrode DE and the output electrode SE may be connected to the semiconductor pattern SP through a first lower contact hole CH1 and a second lower contact hole CH2, respectively, which pass through the first intermediate insulating layer 10 and the second intermediate insulating layer 20. The input electrode DE may correspond to the drain D1 of the driving transistor T1 (see FIG. 2B) illustrated in FIG. 2B, and the output electrode SE may correspond to the source S1 of the driving transistor T1 (see FIG. 2B) illustrated in FIG. 2B.

The insulating layer IL may be disposed on the circuit layer DP-CL. The insulating layer IL may cover the input electrode DE and the output electrode SE. A hole HL may be defined in the insulating layer IL. The insulating layer IL may provide a flat surface for the circuit layer DP-CL at a portion other than the hole HL. The insulating layer IL may include an organic material. For example, the insulating layer IL may include polyimide, etc. The hole HL defined in the insulating layer IL passes through the insulating layer and may be a via-hole. The insulating layer IL may have a stepped region due to a height difference between the hole HL portion and the flat surface.

A display element layer DP-OEL may be disposed on the circuit layer DP-CL. The display element layer DP-OEL may be disposed on the insulating layer IL. The display element layer DP-OEL may include a pixel defining film PDL and the light emitting element OEL.

The pixel defining film PDL may correspond to a non-light emitting region NPXA. An opening portion OH may be defined in a portion of the pixel defining film PDL, which corresponds to a light emitting region PXA. For example, the opening portion OH may be defined in the pixel defining film PDL so as to correspond to each of the plurality of light emitting regions PXA-R, PXA-G and PXA-B (see FIG. 3).

The light emitting element OEL may include the first electrode EL1 a hole transport region HTR, a light emitting layer EML, an electron transport region ETR, and a second electrode EL2.

The first electrode EL1 may be disposed on the circuit layer DP-CL. The first electrode EL1 may be connected to the output electrode SE through the hole HL. The first electrode EL1 of the light emitting element OEL and the output electrode SE may be electrically connected to each other to drive the light emitting element OEL.

The first electrode EL1 may have a top surface exposed in the opening portion OH. The first electrode EL1 may correspond to the light emitting region PXA. The first electrode EL1 may be patterned to correspond to each of the plurality of light emitting regions PXA-R, PXA-G and PXA-B (see FIG. 3).

The first electrode EL1 has conductivity. The first electrode EL1 may be formed of a metal material, a metal alloy, or a conductive compound. The first electrode EL1 may be an anode or a cathode. However, an embodiment is not limited thereto. The first electrode EL1 may be a pixel electrode. The first electrode EL1 may be a transmissive electrode, a transflective electrode, or a reflective electrode. When the first electrode EL1 is the transmissive electrode, the first electrode EL1 may include a transparent metal oxide, for example, indium tin oxide ("ITO"), indium zinc oxide ("IZO"), zinc oxide ($Z_nO$), indium tin zinc oxide ("ITZO"), etc. When the first electrode EL1 is the transflective electrode or the reflective electrode, the first electrode EL1 may include Ag, Mg, Cu, Al, Pt, Pd, Au, Ni, Nd, Ir, Cr, Li, Ca, Mo, Ti, W, or a compound or mixture thereof (e.g., mixture of Ag and Mg). Alternatively, the first electrode EL1 may have a multilayer structure including a reflective film or transflective film formed of the foregoing material, and a transparent conductive film formed of indium tin oxide (ITO), indium zinc oxide (IZO), zinc oxide ($Z_nO$), indium tin zinc oxide (ITZO), etc. For example, the first electrode EL1 may have a three-layer structure of ITO/Ag/ITO, but is not limited thereto. In addition, an embodiment is not limited thereto, and the first electrode EL1 may include the foregoing metal material, a combination of two or more metal materials selected from the foregoing metal materials, an oxide of the foregoing metal materials, or the like.

The light emitting layer EML may be disposed on the first electrode EL1 within the opening portion OH. The light emitting layer EML may correspond to the light emitting region PXA. The light emitting layer EML may be patterned to correspond to each of the plurality of light emitting regions PXA-R, PXA-G and PXA-B (see FIG. 3).

The light emitting layer EML may have a single layer made of a single material, or a single layer made of a plurality of different materials, or may have a multilayer structure having a plurality of layers made of a plurality of different materials. The light emitting layers EML, which correspond to the light emitting regions PXA-R, PXA-G and PXA-B, may include the same material or include different materials. For example, when the light emitting layers EML, which correspond to the light emitting regions PXA-R, PXA-G and PXA-B, include the same material, each of the light emitting layers EML may include a luminescent material that emits blue light. When the light emitting layers EML, which correspond to the light emitting regions PXA-R, PXA-G and PXA-B, include different materials, the light emitting layers EML may include luminescent materials that emit different light.

The hole transport region HTR may be disposed between the first electrode EU and the light emitting layer EML. The hole transport region HTR may extend to be disposed above the pixel defining film PDL. The hole transport region HTR may be disposed as a common layer in the light emitting region PXA and the non-light emitting region NPXA. However, this is just an example, and an embodiment is not limited thereto. The hole transport region HTR may be provided to be patterned inside the opening portion OH defined in the pixel defining film PDL.

The hole transport region HTR may have a single layer made of a single material, or a single layer made of a plurality of different materials, or may have a multilayer structure having a plurality of layers made of a plurality of different materials.

The electron transport region ETR may be disposed on the light emitting layer EML. The electron transport region ETR may extend to be disposed above the pixel defining film PDL. The electron transport region ETR may be disposed as a common layer in the light emitting region PXA and the non-light emitting region NPXA. However, this is just an example, and an embodiment is not limited thereto. The electron transport region ETR may be provided to be patterned inside the opening portion OH defined in the pixel defining film PDL.

The electron transport region ETR may have a single layer made of a single material, or a single layer made of a plurality of different materials, or may have a multilayer structure having a plurality of layers made of a plurality of different materials. For example, the electron transport region ETR may have a structure having a single layer of an electron injection layer (not illustrated) or an electron transport layer (not illustrated), or may have a structure having a single layer made of an electron injection material and an electron transport material.

The second electrode EL2 may be disposed on the electron transport region ETR. The second electrode EL2 may extend to be disposed above the pixel defining film PDL. The second electrode EL2 may be disposed as a common layer in the light emitting region PXA and the non-light emitting region NPXA.

The second electrode EL2 may be a cathode or an anode. For example, when the first electrode EL1 is an anode, the second electrode EL2 may be a cathode, and when the first electrode EL1 is a cathode, the second electrode EL2 may be an anode.

The second electrode EL2 may be a transmissive electrode, a transflective electrode, or a reflective electrode. When the second electrode EL2 is the transmissive electrode, the second electrode EL2 may be made of a transparent metal oxide, for example, indium tin oxide (ITO), indium zinc oxide (IZO), zinc oxide ($Z_nO$), indium tin zinc oxide (ITZO), etc.

When the second electrode EL2 is the transflective electrode or the reflective electrode, the second electrode EL2 may include Ag, Mg, Cu, Al, Pt, Pd, Au, Ni, Nd, Ir, Cr, Li, Ca, Mo, Ti, W, or a compound or mixture thereof (e.g., AgMg, AgYb, or MgAg). Alternatively, the second electrode EL2 may have a multilayer structure including a reflective film or transflective film formed of the foregoing material, and a transparent conductive film formed of indium tin oxide (ITO), indium zinc oxide (IZO), zinc oxide ($Z_nO$), or indium tin zinc oxide (ITZO), etc. For example, the second electrode EL2 may include the foregoing metal material, a combination of two or more metal materials selected from the foregoing metal materials, an oxide of the foregoing metal materials, or the like.

An auxiliary opening portion SOH may be defined in a portion of the pixel defining film PDL, which overlaps the non-light emitting region NPXA. The auxiliary opening portion SOH may be disposed apart from the opening portion OH having the light emitting layer disposed therein in the first direction DR1. The hole transport region HTR and the electron transport region ETR may extend to be disposed within the auxiliary opening portion SOH. A contact hole CTH passing through the hole transport region HTR and the electron transport region ETR may be defined within the auxiliary opening portion SOH. The second electrode EL2 may extend to be disposed within the contact hole CTH. FIG. 5 illustrates that the second electrode EL2 extends to be disposed within the contact hole CTH and an opening portion is not defined. However, an embodiment is not limited thereto. For example, an opening portion passing through the second electrode EL2 may be defined within the contact hole CTH.

The lower auxiliary electrode BML may be disposed on the circuit layer DP-CL. The lower auxiliary electrode BML may have a top surface exposed in the contact hole CTH. The lower auxiliary electrode BML may be electrically connected to the second electrode EL2. The lower auxiliary electrode BML may be an electrode that receives the second voltage ELVSS (FIG. 2B). That is, the second electrode EL2 may receive the second voltage ELVSS (FIG. 2B) through the lower auxiliary electrode BML.

The upper auxiliary electrode UML may be disposed on the second electrode EL2 extending to the non-light emitting region NPXA. The upper auxiliary electrode UML may not overlap the light emitting region PXA. That is, the upper auxiliary electrode UML may not overlap the light emitting layer EML and the first electrode EL1 in a plan view. The upper auxiliary electrode UML may overlap the hole transport region HTR and the electron transport region ETR, which extend to the non-light emitting region NPXA in a plan view.

The upper auxiliary electrode UML may have a resistivity lower than a resistivity of the second electrode EL2. The resistivity of the upper auxiliary electrode UML may be greater than about 0 ohm-centimeter ($\Omega$cm) and less than or equal to about $4.4\times10^{-6}$ $\Omega$cm. For example, the resistivity of the upper auxiliary electrode UML may be about $2.1\times10^{-6}$ cm to about $4.4\times10^{-6}$ $\Omega$cm. The upper auxiliary electrode UML may include silver or copper. However, this is just an example, and an embodiment is not limited thereto. The upper auxiliary electrode UML may include another metal material having a resistivity lower than the resistivity of the second electrode EL2.

In the display apparatus DD according to an embodiment, the second electrode EL2 and the upper auxiliary electrode UML having a resistivity lower than the resistivity of the second electrode EL2 are electrically connected to each other so that resistance of the second electrode EL2 may decrease and accordingly, a voltage drop (IR drop) occurring in the second electrode EL2 may be reduced. When the voltage drop of the second electrode EL2 is reduced, stains generated in the display region DA (FIG. 1) due to the voltage drop may be reduced to improve the display quality of the display apparatus DD.

In addition, when the upper auxiliary electrode UML is disposed on the second electrode EL2, the second electrode EL2 may be tightly disposed in a direction of the lower auxiliary electrode BML to improve contact characteristics between the second electrode EL2 and the lower auxiliary electrode BML. Accordingly, the electrical connection characteristics between the second electrode EL2 and the lower auxiliary electrode BML may be improved to improve the display quality of the display apparatus DD.

The encapsulation layer TFE may cover the light emitting element OEL. The encapsulation layer TFE may seal the display element layer DP-OEL. The encapsulation layer TFE may be a thin film encapsulation layer. The encapsulation layer TFE may have a single-layer structure or a structure in which a plurality of layers is stacked. The encapsulation layer TFE includes at least one insulating layer. The encapsulation layer TFE according to an embodiment may include at least one inorganic film (hereinafter referred to as an inorganic encapsulation film). In addition, the encapsulation layer TFE according to an embodiment may include at least one organic film (hereinafter referred to as an organic encapsulation film) and at least one inorganic encapsulation film.

The inorganic encapsulation film protects the display element layer DP-OEL from moisture or oxygen, and the organic encapsulation layer protects the display element layer DP-OEL from foreign matters such as dust particles. The inorganic encapsulation film may include a silicon nitride, a silicon oxynitride, a silicon oxide, a titanium oxide, an aluminum oxide, or the like, and is not particularly limited thereto. The organic encapsulation layer may include an acrylic compound, an epoxy-based compound, etc. The organic encapsulation layer may include a photopolymerizable organic material and is not particularly limited.

The encapsulation layer TFE may be disposed on the second electrode EL2 and disposed to fill the opening portion OH.

Referring to FIGS. 5 to 7A, the upper auxiliary electrode UML may include a first portion PA1 having a first thickness $T_1$ and a second portion PA2 having a second thickness $T_2$. The first thickness $T_1$ may be greater than the second thickness $T_2$. Accordingly, the first portion PA1 may have lower resistance than the second portion PA2.

The first portion PA1 may be disposed more adjacent to the power pads PD (see FIG. 2A) than the second portion PA2 is. The thickness of the upper auxiliary electrode UML may increase toward the power pads PD (see FIG. 2A). That is, the first portion PA1 may be more adjacent to the power pads PD (see FIG. 2A) than the second portion PA2 is. The lower the resistance of the upper auxiliary electrode UML, the smaller the voltage drop caused by the upper auxiliary electrode UML, so that the display quality may be improved.

As the lower the resistance of the upper auxiliary electrode UML adjacent to the power pads PD (see FIG. 2A), the more the voltage drop may be. For example, when an amount of current flowing through the first portion PA1 adjacent to the power pads PD (see FIG. 2A) is greater than an amount of current flowing through the second portion PA2 relatively far away from the power pads PD (see FIG. 2A) and thus the resistance value of the first portion PA1 decreases, the voltage drop may be more reduced compared to when the resistance value of the second portion PA2 decreases. That is, the display apparatus DD according to an embodiment includes the upper auxiliary electrode UML in which the first thickness $T_1$ of the first portion PA1 adjacent to the power pads PD (see FIG. 2A) that supply power is greater than the second thickness $T_2$ of the second portion PA2, so that the voltage drop may be reduced and accordingly, the display quality of the display apparatus DD may be improved. Moreover, compared to when the entirety of the thickness of the upper auxiliary electrode UML increases, less materials may be used to efficiently reduce the voltage drop.

FIGS. 5, 6, and 7A illustrate that the upper auxiliary electrode UML includes the first portion PA1 having the first thickness $T_1$ and the second portion PA2 having the second thickness $T_2$. However, an embodiment is not limited thereto. For example, the upper auxiliary electrode UML according to an embodiment may include three or more portions having different thicknesses, and any structure may be applied without limitation as long as a portion adjacent to the power pads PD (see FIG. 2A) has a greater thickness than a portion spaced apart from the power pads PD (see FIG. 2A). In an embodiment, as illustrated in FIG. 7B, the thickness of the upper auxiliary electrode UML may gradually decrease away from the power pads PD (see FIG. 2A).

Figure 8:
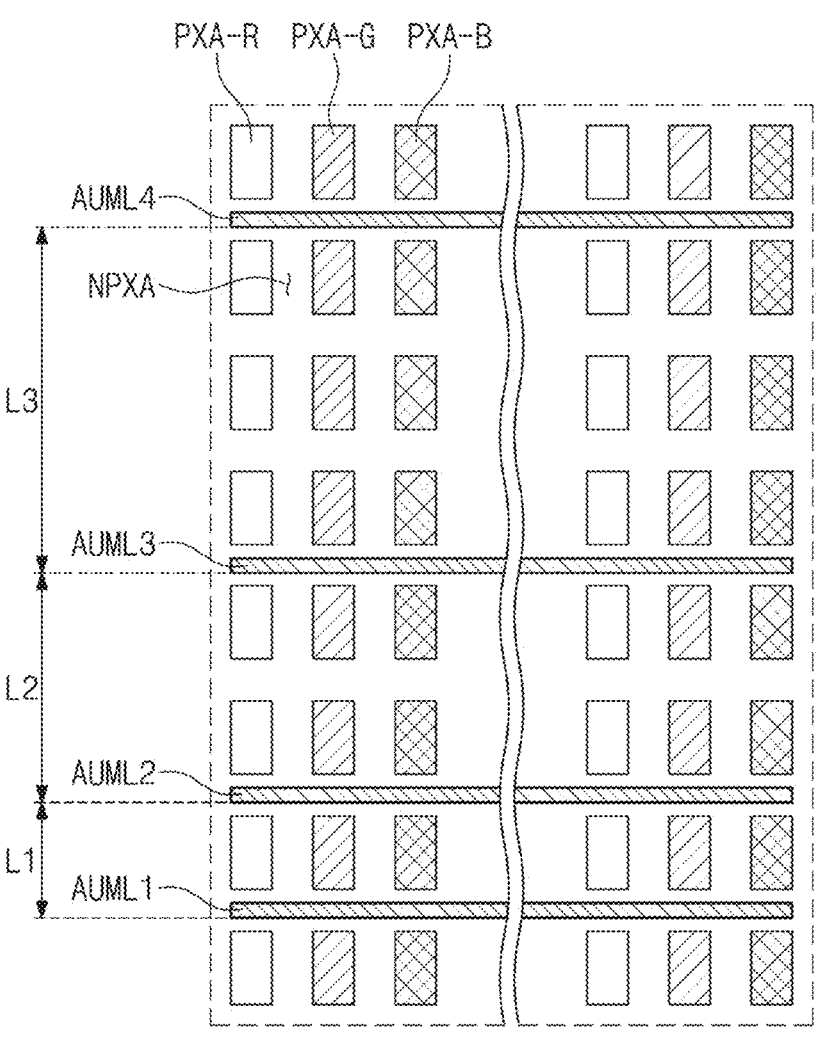
FIG. 8 is a cross-sectional view of a display apparatus according to an embodiment.
Figure 8:
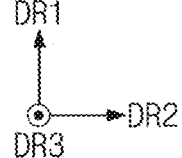

FIG. 8 is a cross-sectional view of a display apparatus according to an embodiment. Referring to FIG. 8, in an embodiment, additional upper auxiliary electrodes AUML1 to AUML4 may be further included (in other words, referred to as "crossing-upper auxiliary electrodes"). The additional upper auxiliary electrodes AUML1 to AUML4 may extend in the second direction DR2. Each of the additional upper auxiliary electrodes AUML1 to AUML4 may be disposed in the non-light emitting region NPXA. A first additional upper auxiliary electrode AUML1 may be more adjacent to the power pads PD (see FIG. 2A) than a fourth additional upper auxiliary electrode AUML4 is.

Spacings between adjacent additional upper auxiliary electrodes AUML1 to AUML4 may be different from each other. The spacings between the adjacent additional upper auxiliary electrodes AUML1 to AUML4 may increase as being farther away from the power pads PD (see FIG. 2A). A spacing L2 (i.e., distance in the first direction DR1) between a second additional upper auxiliary electrode AUML2 and a third additional upper auxiliary electrode AUML3 may be greater than a spacing L1 between the first additional upper auxiliary electrode AUML1 and the second additional upper auxiliary electrode AUML2. A spacing L3 between the third additional upper auxiliary electrode AUML3 and the fourth additional upper auxiliary electrode AUML4 may be greater than the spacing L2 between the second additional upper auxiliary electrode AUML2 and the third additional upper auxiliary electrode AUML3. An embodiment has a structure in which the spacings between the adjacent additional upper auxiliary electrodes AUML1 to AUML4 increase as being farther away from the power pads PD (see FIG. 2A), and thus may have the same effect as the embodiment in which a portion adjacent to the power pads PD (see FIG. 2A) has a relatively great thickness. Accordingly, the voltage drop may be reduced in the display apparatus DD (see FIG. 1) and the display quality of the display apparatus DD (see FIG. 1) may be improved.

Hereinafter, a display apparatus manufacturing method according to an embodiment will be described with reference to FIGS. 9 to 12F. The structural features of the display apparatus described with reference to FIGS. 1 to 8 will not be described again, and the features of the display apparatus manufacturing method will be mainly described.

Figure 9:
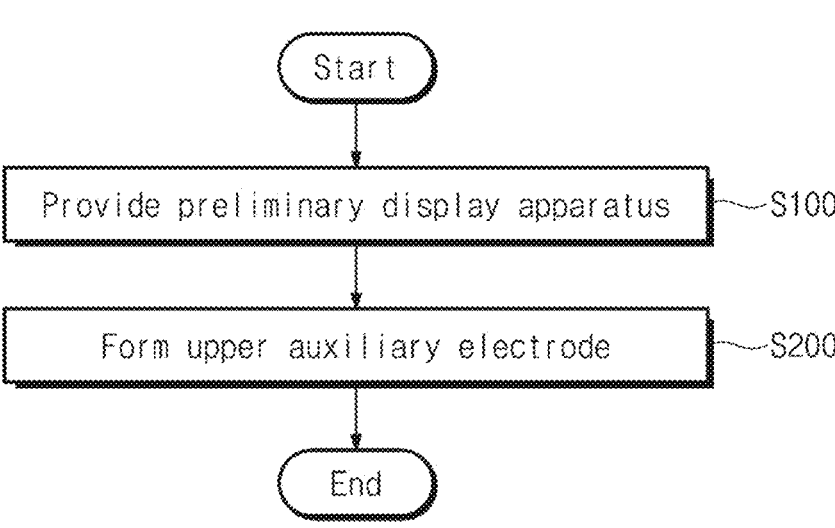
FIG. 9 is a flowchart of a display apparatus manufacturing method according to an embodiment.
Figure 10A:
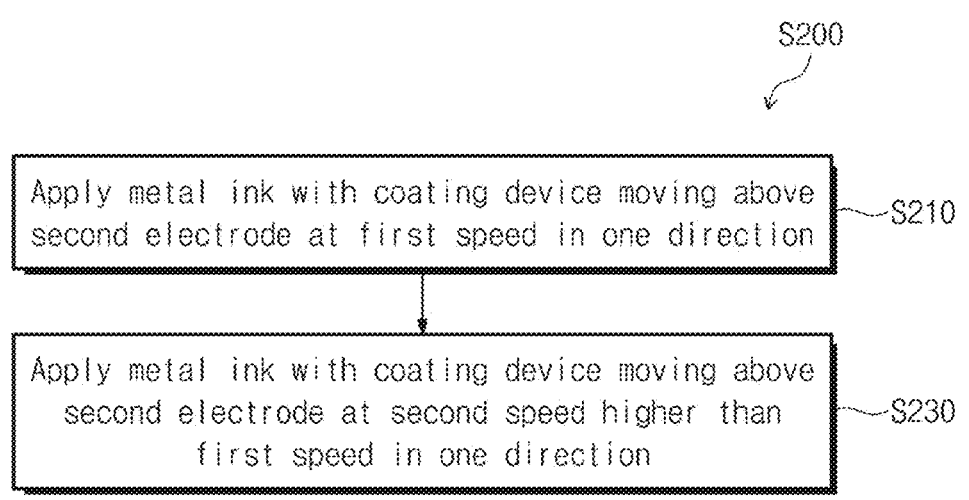
FIG. 10A is a flowchart of an operation of a display apparatus manufacturing method according to an embodiment.
Figure 10B:
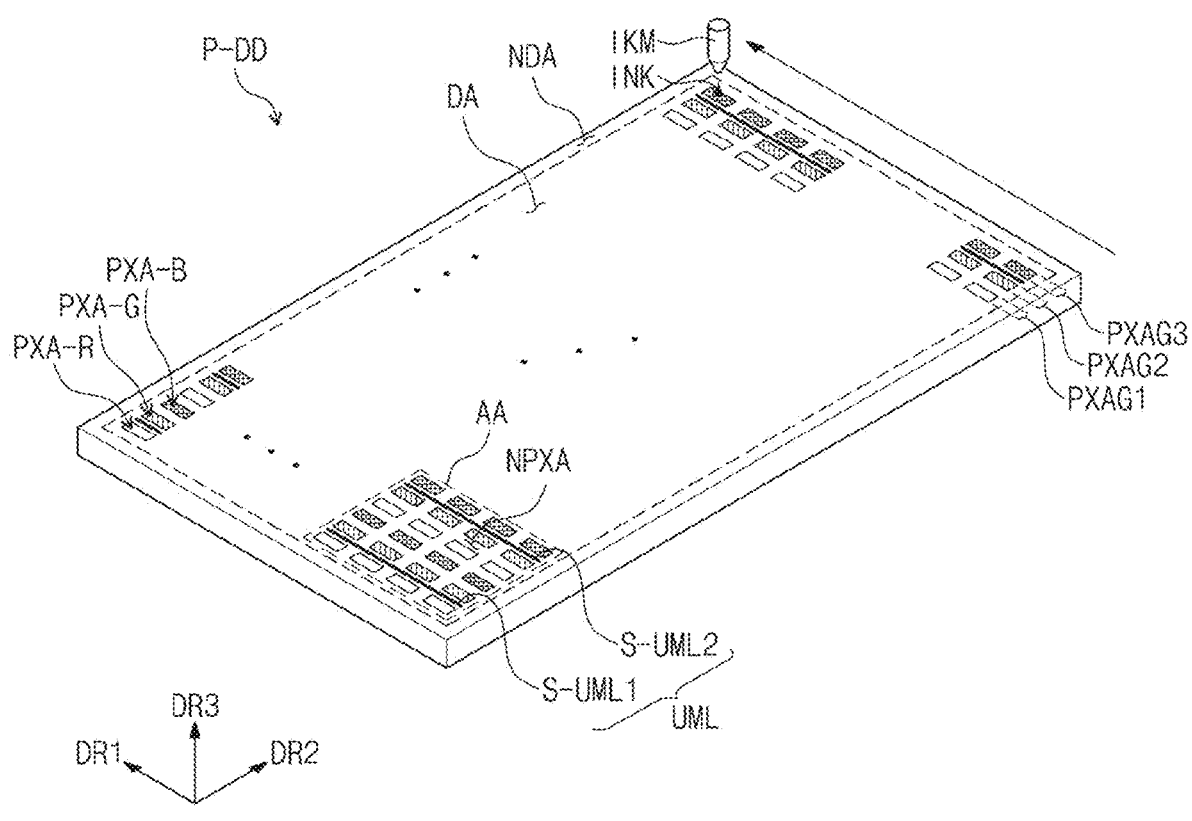
FIG. 10B is a view illustrating an operation of a display apparatus manufacturing method according to an embodiment.
Figure 10C:
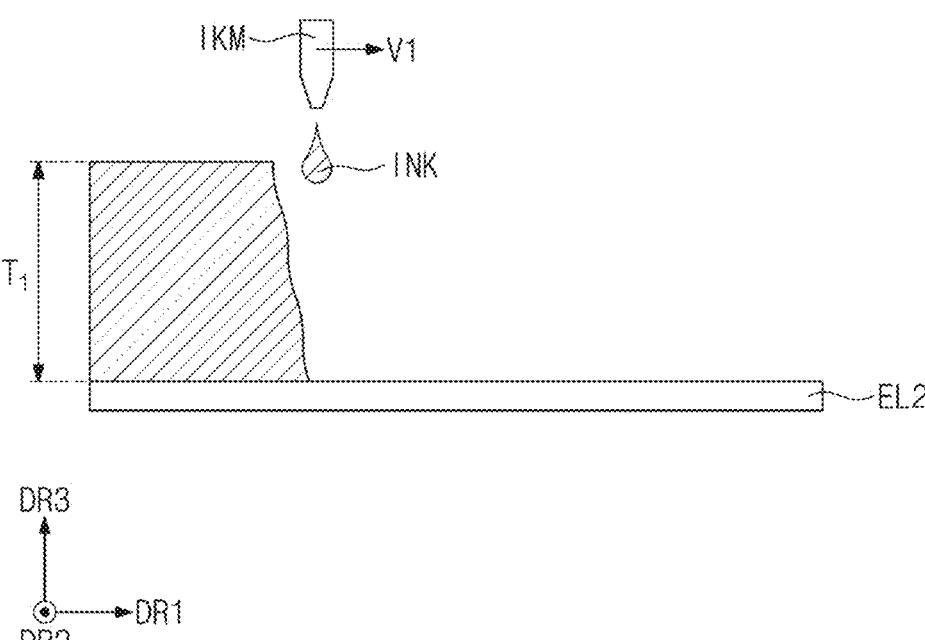
FIG. 10C is a view illustrating an operation of a display apparatus manufacturing method according to an embodiment.
Figure 10D:
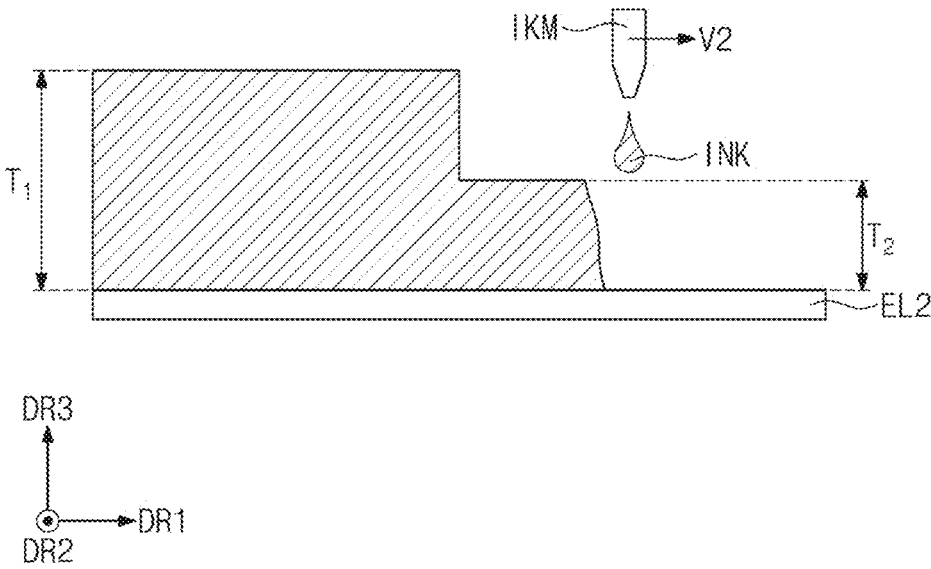
FIG. 10D is a view illustrating an operation of a display apparatus manufacturing method according to an embodiment.

FIG. 9 is a flowchart of a display apparatus manufacturing method according to an embodiment. FIG. 10A is a flowchart of an operation of a display apparatus manufacturing method according to an embodiment. FIG. 10B is a view illustrating an operation of a display apparatus manufacturing method according to an embodiment. FIG. 10C is a view illustrating an operation of a display apparatus manufacturing method according to an embodiment. FIG. 10D is a view illustrating an operation of a display apparatus manufacturing method according to an embodiment. FIGS. 10C and 10D are each a view schematically illustrating applying of a metal ink.

Referring to FIG. 9, the display apparatus manufacturing method according to an embodiment may include: providing a preliminary display apparatus P-DD (S100) and forming an upper auxiliary electrode UML (S200).

FIG. 10A is a flowchart of the applying of the metal ink. Referring to FIG. 10A, the applying of the metal ink (S200)

according to an embodiment may include: first-applying the metal ink INK with the coating device IKM moving at a first speed V1 (S210), and second applying of the metal ink INK with the coating device IKM moving at a second speed V2 higher than the first speed V1 (S230). The coating device IKM may move along the first direction DR1. While moving along the first direction DR1, the coating device IKM may apply the metal ink INK to form one upper auxiliary electrode UML (see FIG. 4).

Referring to FIGS. 10B to 10D, the display apparatus manufacturing method according to an embodiment may include: applying a metal ink INK onto the preliminary display apparatus P-DD using a coating device IKM to form the upper auxiliary electrode UML. In an embodiment, the speed of the coating device IKM may gradually increase from the first speed V1 to the second speed V2. In an embodiment, when the speed of the coating device IKM gradually increases from the first speed V1 to the second speed V2, the formed upper auxiliary electrode UML may have the shape illustrated in FIG. 7B.

However, this is just an example, and an embodiment is not limited thereto. The speed of the coating device IKM may change twice or more. When the speed of the coating device IKM changes twice or more, the speed of the coating device IKM may change gradually at least once and change in a stopped state at least once.

The first applying (S210) in which the coating device IKM moves at the first speed V1 to apply the metal ink INK may be an operation of forming the first portion PA1 (see FIG. 7A) having the first thickness $T_1$. The second applying (S230) in which the coating device IKM moves at the second speed V2 to apply the metal ink INK may be an operation of forming the second portion PA2 (see FIG. 7A) having the second thickness $T_2$. The display apparatus manufacturing method according to an embodiment may control the speed of the coating device IKM that applies the metal ink INK and thus may adjust the thickness of the upper auxiliary electrode UML (see FIG. 7A). Accordingly, the display apparatus manufacturing method according to an embodiment may manufacture a display apparatus with improved display quality and including the upper auxiliary electrode UML (see FIG. 7A) in which a portion closer to the power pads PD (see FIG. 2A) has a great thickness and a portion far away from the power pads PD (see FIG. 2A) has a small thickness. Moreover, compared to when the entirety of the thickness of the upper auxiliary electrode UML increases, the display apparatus manufacturing method according to an embodiment uses less materials and less processing time and thus has an effect of achieving cost reduction and process efficiency.

Figure 11:
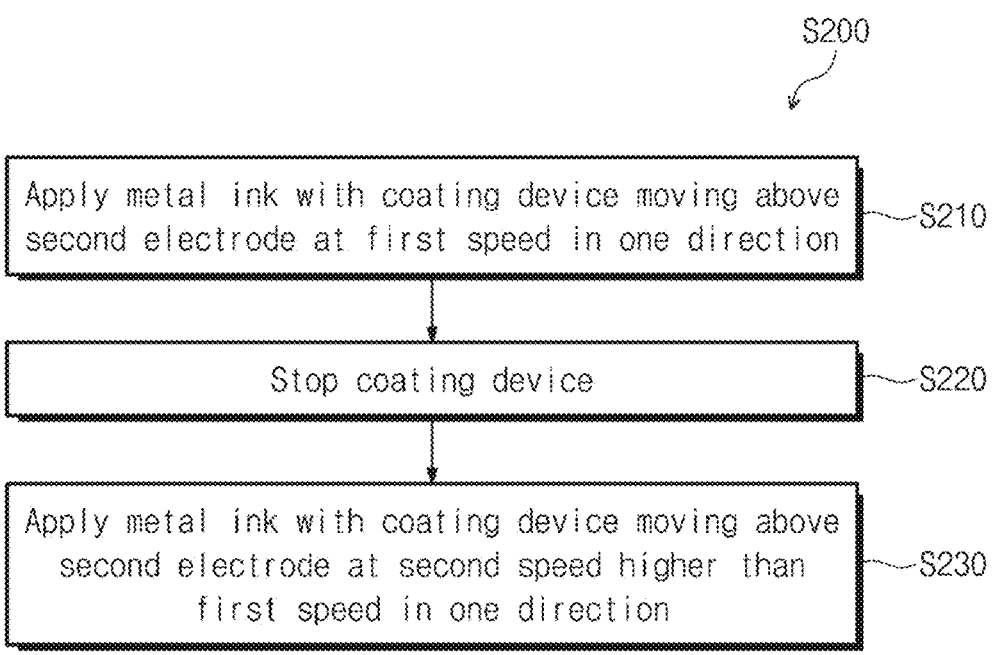
FIG. 11 is a flowchart of an operation of a display apparatus manufacturing method according to an embodiment.

FIG. 11 is a flowchart of an operation of a display apparatus manufacturing method according to an embodiment. Referring to FIG. 11, in an embodiment, the applying of the metal ink (S200) may further include stopping (S220) the coating device after the first-applying (S210) of the metal ink INK (see FIG. 10C) with the coating device IKM (see FIG. 10C) moving at the first speed V1 (see FIG. 10C), and before the second-applying (S230) of the metal ink INK (see FIG. 10C) with the coating device IKM (see FIG. 10C) moving at the second speed V2 (see FIG. 10D) higher than the first speed V1 (see FIG. 10C). After the stopping (S220), the speed of the coating device IKM (see FIG. 10C) may change to the second speed V2 (see FIG. 10D). In an embodiment, when the stopping (S220) is included, the upper auxiliary electrode UML (see FIG. 7A) may have the shape illustrated in FIG. 7A.

Figure 12A:
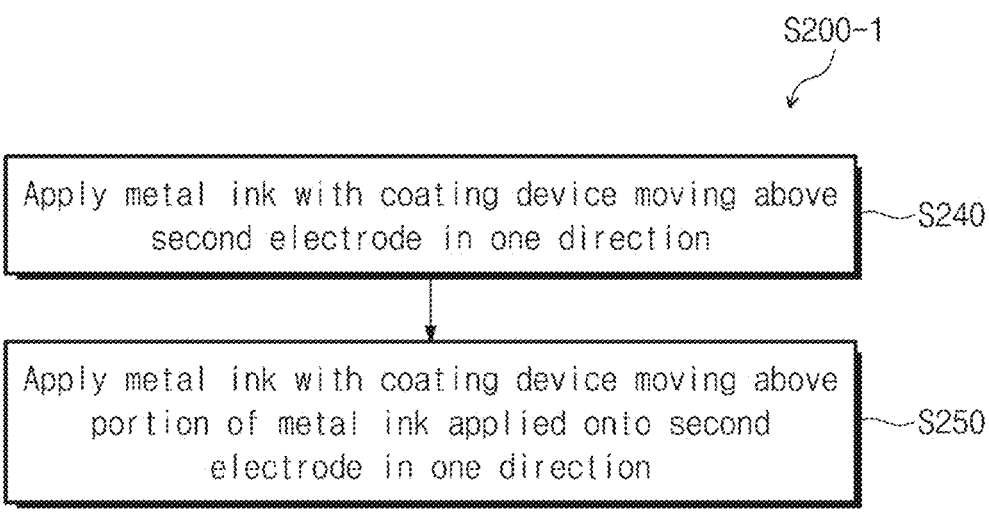
FIG. 12A is a flowchart of an operation of a display apparatus manufacturing method according to an embodiment.
Figure 12B:
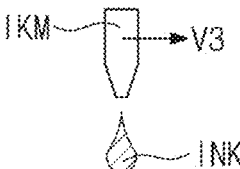
FIG. 12B is a view schematically illustrating an operation of a display apparatus manufacturing method according to an embodiment.
Figure 12B:
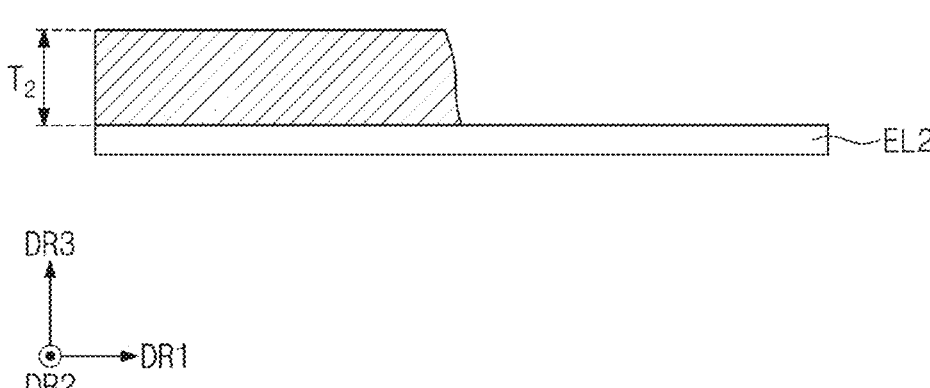
Figure 12C:
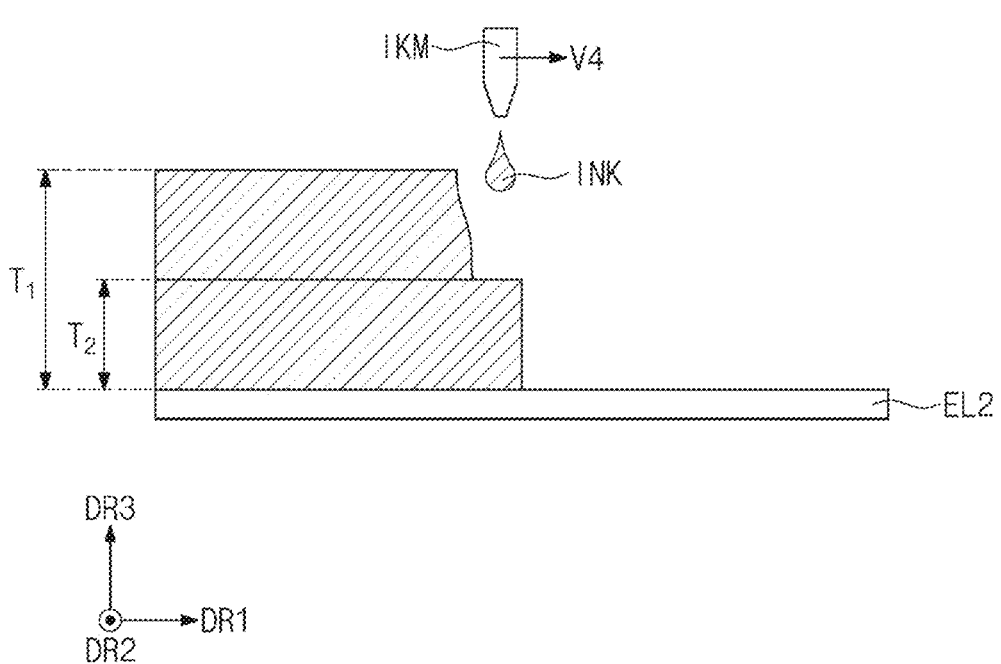
FIG. 12C is a view schematically illustrating an operation of a display apparatus manufacturing method according to an embodiment.
Figure 12D:
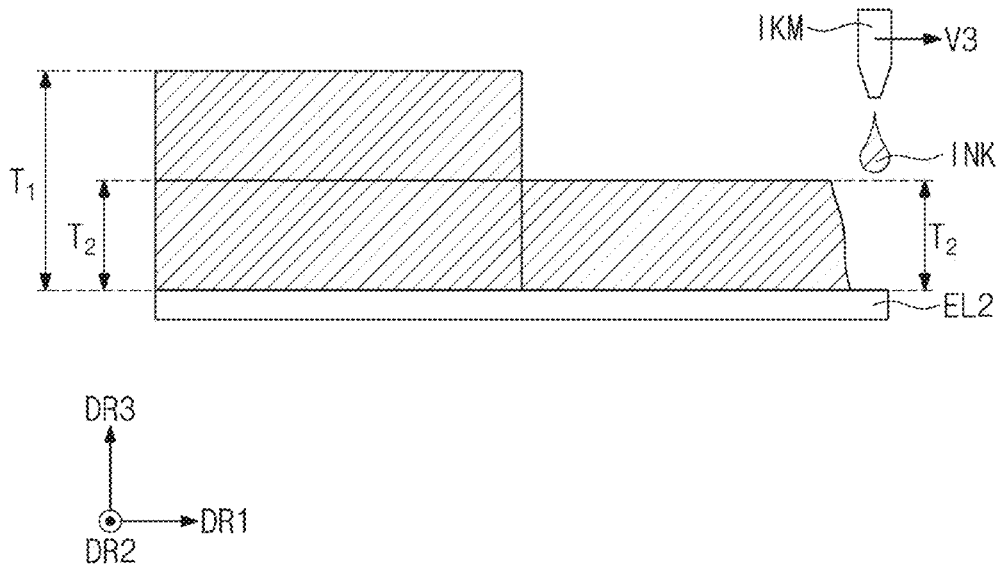
FIG. 12D is a view schematically illustrating an operation of a display apparatus manufacturing method according to an embodiment.
Figure 12E:
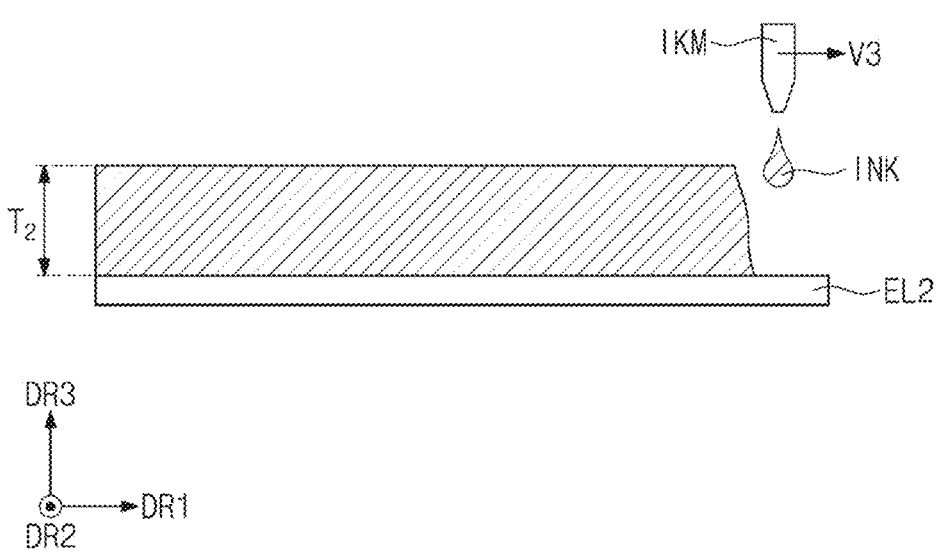
FIG. 12E is a view schematically illustrating an operation of a display apparatus manufacturing method according to an embodiment.
Figure 12F:
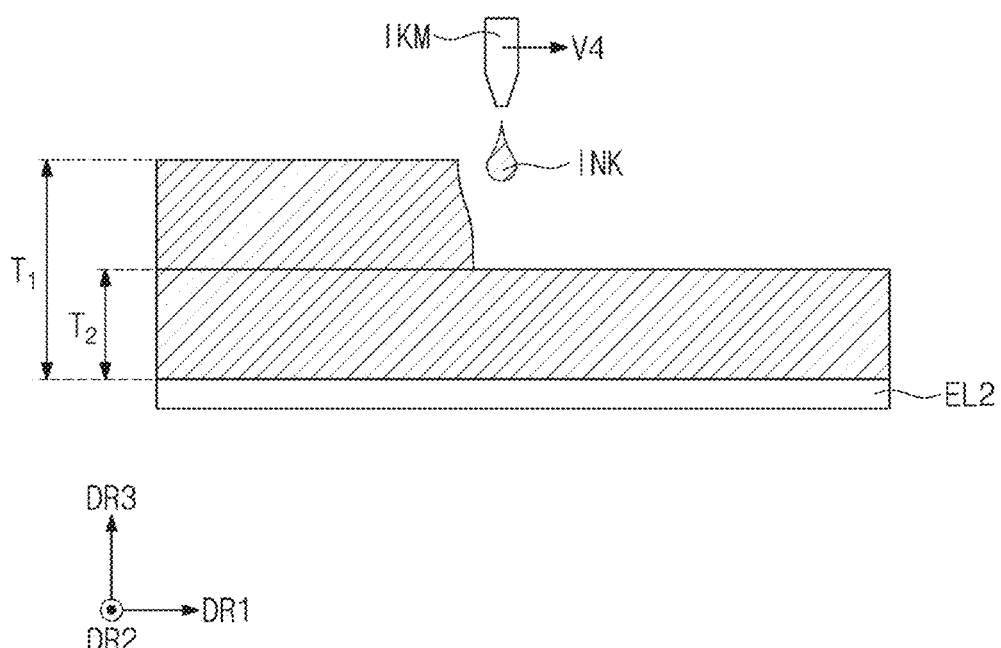
FIG. 12F is a view schematically illustrating an operation of a display apparatus manufacturing method according to an embodiment.

FIG. 12A is a flowchart of an operation of a display apparatus manufacturing method according to an embodiment. FIG. 12B is a view schematically illustrating an operation of a display apparatus manufacturing method according to an embodiment. FIG. 12C is a view schematically illustrating an operation of a display apparatus manufacturing method according to an embodiment. FIG. 12D is a view schematically illustrating an operation of a display apparatus manufacturing method according to an embodiment. FIG. 12E is a view schematically illustrating an operation of a display apparatus manufacturing method according to an embodiment. FIG. 12F is a view schematically illustrating an operation of a display apparatus manufacturing method according to an embodiment.

Referring to FIGS. 12A to 12F, in an embodiment, applying of a metal ink (S200-1) may include: a first operation (S240), in which a coating device IKM applies a metal ink INK above a second electrode EL2, and a second operation (S250) in which the coating device IKM applies the metal ink INK onto a portion above the metal ink INK applied onto the second electrode EL2 while moving in one direction (e.g., the first direction DR1). The first portion PA1 (see FIG. 7A) of the upper auxiliary electrode UML (see FIG. 7A) may include both the metal ink INK applied in the first operation (S240) and the metal ink INK applied in the second operation (S250). The second portion PA2 (see FIG. 7A) of the upper auxiliary electrode UML (see FIG. 7A) may include the metal ink INK applied in the first operation (S240).

In the first operation (S240), the coating device IKM may move at a third speed V3 above the second electrode EL2 to from an ink layer having the second thickness $T_2$, using the metal ink INK (See FIGS. 12B, 12D, and 12E). In the second operation (S250), the coating device IKM may move at a fourth speed V4 above the metal ink INK applied onto the second electrode EL2 to from an ink layer having the first thickness $T_1$ on the portion of the second electrode EL2 (See FIGS. 12C and 12F). As a result, the upper auxiliary electrode UML (see FIG. 7A) including the first portion PA1 (see FIG. 7A) and the second portion PA2 (see FIG. 7A) illustrated in FIG. 7A may be manufactured.

FIGS. 12B to 12D illustrate an embodiment that the first operation (S240) is performed on a portion of the second electrode EL2, the second operation (S250) is performed on the metal ink INK applied on the portion of the second electrode EL2, and then the first operation (S240) is performed again on a next portion of the second electrode EL2.

FIGS. 12E to 12F illustrate an embodiment that the first operation (S240) is performed on all portions of the second electrode EL2, and then the second operation (S250) is performed on the metal ink INK applied on a portion of the second electrode EL2.

The display apparatus according to an embodiment may include the upper auxiliary electrode that is disposed on the second electrode and includes the first portion and the second portion having the smaller thickness than the first portion. The upper auxiliary electrode may include the first portion having the great thickness to reduce the voltage drop occurring in the second electrode. Accordingly, stains generated in the display region due to the voltage drop may be reduced and the display quality of the display apparatus may be improved.

The display apparatus manufacturing method according to an embodiment may include moving the coating device, which applies the metal ink, to form the upper auxiliary electrode including the first portion and the second portion having the smaller thickness than the first portion, thereby providing the display apparatus in which the voltage drop is reduced and accordingly, the display quality is improved.

The display apparatus according to an embodiment may include, on the second electrode, the upper auxiliary electrode including the first portion having the low resistivity and the great thickness and the second portion having the small thickness, thereby reducing the voltage drop and exhibiting the excellent display quality.

The display apparatus manufacturing method according to an embodiment may include the forming of, on the second electrode, the upper auxiliary electrode including the first portion having the low resistivity and the great thickness and the second portion having the small thickness, thereby providing the display apparatus with the reduced voltage drop and exhibiting the excellent display quality.

Although the embodiments of the present invention have been described, it is understood that the present invention should not be limited to these embodiments but various changes and modifications can be made by one ordinary skilled in the art within the spirit and scope of the present invention as hereinafter claimed.

Therefore, the technical scope of the invention is not limited to the contents described in the detailed description of the specification, but should be determined by the claims.

What is claimed is:

1. A display apparatus, which comprises a display region and a peripheral region adjacent to the display region, the display region comprising light emitting regions and a non-light emitting region adjacent to each of the light emitting regions, the display apparatus comprising:

a base layer;

a power pad disposed on the base layer to overlap the peripheral region;

a pixel defining film which is disposed on the base layer and in which an opening portion is defined to correspond to each of the light emitting regions;

a first electrode disposed on the base layer and patterned to correspond to each of the light emitting regions;

a light emitting layer disposed on the first electrode and patterned to correspond to each of the light emitting regions;

a second electrode disposed on the light emitting layer and electrically connected to the power pad; and at least one upper auxiliary electrode disposed on the second electrode to overlap the non-light emitting region, extending in a first direction, and having a resistivity lower than a resistivity of the second electrode, wherein the at least one upper auxiliary electrode comprises:

a first portion adjacent to the power pad in the first direction and having a first thickness, and a second portion having a second thickness smaller than the first thickness and spaced apart from the power pad with the first portion therebetween.

2. The display apparatus of claim 1, wherein the at least one upper auxiliary electrode has a thickness that gradually decreases from the first portion toward the second portion.

3. The display apparatus of claim 1, wherein the first portion is more adjacent to the power pad than the second portion.

4. The display apparatus of claim 1, wherein:

the light emitting region comprises first to third light emitting regions disposed apart from each other;

the first light emitting region emits first light;

the second light emitting region emits second light that has a different wavelength from the first light; and the third light emitting region emits third light that has a different wavelength from the first light and the second light.

5. The display apparatus of claim 4, wherein the at least one upper auxiliary electrode comprises:

a first upper auxiliary electrode; and a second upper auxiliary electrode disposed apart from the first upper auxiliary electrode with at least one of the first to third light emitting regions therebetween in a second direction perpendicular to the first direction.

6. The display apparatus of claim 1, wherein the at least one upper auxiliary electrode has a resistivity of greater than about 0 ohm-centimeter ($\Omega$cm) and less than or equal to about $4.4 \times 10^{-6}$ $\Omega$cm.

7. The display apparatus of claim 1, wherein the at least one upper auxiliary electrode comprises silver (Ag) or copper (Cu).

8. The display apparatus of claim 1, further comprising:

a hole transport region disposed between the first electrode and the light emitting layer; and an electron transport region disposed between the light emitting layer and the second electrode, wherein each of the hole transport region and the electron transport region extends to be disposed above the pixel defining film.

9. The display apparatus of claim 8, wherein:

an auxiliary opening portion is defined in the pixel defining film to overlap the at least one upper auxiliary electrode, and a contact hole is defined to pass through the hole transport region and the electron transport region that extend into the upper auxiliary electrode; and the display apparatus further comprises a lower auxiliary electrode disposed on the base layer and having a top surface exposed by the contact hole.

10. The display apparatus of claim 1, wherein the at least one upper auxiliary electrode is electrically connected to the second electrode.

11. The display apparatus of claim 1, further comprising a plurality of crossing-upper auxiliary electrodes extending in a second direction perpendicular to the first direction, wherein a distance between adjacent crossing-upper auxiliary electrodes among the plurality of crossing-upper auxiliary electrodes increases as being farther away from the power pad.

* * * * *